United States Patent
Kim

(10) Patent No.: US 11,164,922 B2
(45) Date of Patent: Nov. 2, 2021

(54) METHOD OF FABRICATING LIGHT-EMITTING DISPLAY DEVICE

(71) Applicant: SAMSUNG DISPLAY CO., LTD., Yongin-si (KR)

(72) Inventor: Geun Tak Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 10 days.

(21) Appl. No.: 16/560,413

(22) Filed: Sep. 4, 2019

(65) Prior Publication Data

US 2019/0393287 A1    Dec. 26, 2019

Related U.S. Application Data

(62) Division of application No. 15/008,551, filed on Jan. 28, 2016, now Pat. No. 10,424,624.

(30) Foreign Application Priority Data

Jun. 29, 2015    (KR) .................. 10-2015-0092088

(51) Int. Cl.
*H01L 51/00*    (2006.01)
*H01L 51/56*    (2006.01)
*H01L 27/32*    (2006.01)

(52) U.S. Cl.
CPC ...... *H01L 27/3246* (2013.01); *H01L 51/0005* (2013.01); *H01L 51/0012* (2013.01); *H01L 51/56* (2013.01)

(58) Field of Classification Search
None
See application file for complete search history.

(56) References Cited

U.S. PATENT DOCUMENTS 8,124,301 B2    2/2012    Fujikawa et al.
8,940,568 B2    1/2015    Mohan et al.
(Continued)

FOREIGN PATENT DOCUMENTS

CN    101076211 A    11/2007
CN    102473849 A    5/2012
(Continued)

OTHER PUBLICATIONS

Office Action dated Dec. 18, 2018 from the corresponding Chinese Application No. 201610352990.4.

*Primary Examiner* — Shaun M Campbell
*Assistant Examiner* — Aneta B Cieslewicz
(74) *Attorney, Agent, or Firm* — Lewis Roca Rothgerber Christie LLP

(57) ABSTRACT

A light-emitting display device includes a pixel defining layer with an opening that exposes a first electrode, a hole injection layer on the first electrode, a lyophilic pattern on the hole injection layer in the opening, a hole transport layer on the lyophilic pattern, a light-emitting layer on the hole transport layer, and a second electrode on the light-emitting layer. The lyophilic pattern includes a first part adjacent to a first sidewall of the opening and a second part adjacent to a second sidewall of the opening. A distance from a top surface of the hole injection layer to an edge of a top surface of the second part corresponds to a first height. A distance from the top surface of the hole injection layer to a top surface of the first part corresponds to a second height. The first height is lower than the second height.

3 Claims, 28 Drawing Sheets

(56) References Cited

U.S. PATENT DOCUMENTS

| | | |
|---|---|---|
| 8,987,717 B2 | 3/2015 | Kang |
| 9,105,859 B2 | 8/2015 | Ueno et al. |
| 2004/0185348 A1* | 9/2004 | Progler .................... G03F 1/30 430/5 |
| 2007/0269621 A1 | 11/2007 | Mitsuhashi et al. |
| 2012/0119201 A1 | 5/2012 | Ueno et al. |
| 2012/0319090 A1 | 12/2012 | Shinkai et al. |
| 2013/0119366 A1* | 5/2013 | Nishiyama .......... H01L 51/5088 257/40 |
| 2013/0140542 A1 | 6/2013 | Harada et al. |
| 2014/0077182 A1* | 3/2014 | Kim ....................... H01L 51/56 257/40 |
| 2014/0131671 A1* | 5/2014 | Lee .................... H01L 51/0003 257/40 |

FOREIGN PATENT DOCUMENTS

| | | |
|---|---|---|
| KR | 10-2014-0037393 A | 3/2014 |
| KR | 10-2014-0045157 A | 4/2014 |
| KR | 10-2014-0061119 A | 5/2014 |

\* cited by examiner

FIG. 20
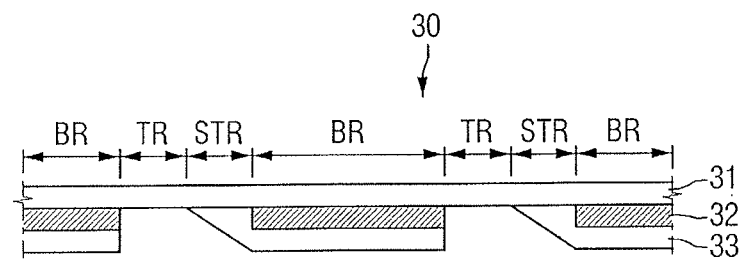
FIG. 21
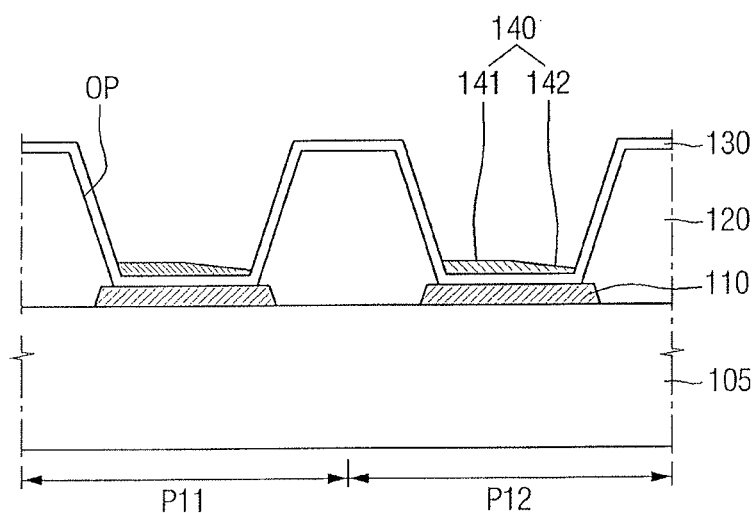
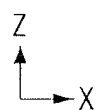

METHOD OF FABRICATING LIGHT-EMITTING DISPLAY DEVICE

CROSS-REFERENCE TO RELATED APPLICATIONS

This is a divisional application based on pending application Ser. No. 15/008,551, filed Jan. 28, 2016, the entire contents of which is hereby incorporated by reference.

Korean Patent Application No. 10-2015-0092088, filed on Jun. 29, 2015, and entitled, "Light-Emitting Display Device and Method of Fabricating the Same," is incorporated by reference herein in its entirety.

BACKGROUND

1. Field

One or more embodiments described herein relate to a light-emitting display device and a method for fabricating a light-emitting display device.

2. Description of the Related Art

An organic light-emitting display has a relatively wide viewing angle, high contrast, and fast response speed. Each pixel of this display includes an organic light-emitting layer between an anode and a cathode. When positive and negative voltages are respectively applied to these electrodes, holes move from the anode to the organic light-emitting layer via a hole injection layer and a hole transport layer, and electrons move from the cathode to the organic light-emitting layer via an electron injection layer and an electron transport layer. The electrons and holes recombine in the organic light-emitting layer to generate excitons. When the excitons change from an excited state to a ground state, light is emitted. The light emitted from the pixels generates an image.

The organic light-emitting display may include a pixel defining layer having an opening that exposes the anode. The hole injection layer, hole transport layer, organic light-emitting layer, electron transport layer, electron injection layer, and cathode may be formed on the anode exposed through the opening in the pixel defining layer.

The hole transport layer and the organic light-emitting layer may be formed as thin layers using an inkjet printing method or a nozzle printing method. These methods may use an ejector to eject a solution into the opening of the pixel defining layer. During the inkjet printing method, a material to be printed may be applied at a desired location in the form of ink droplets. During the nozzle printing method, a material to be printed at a desired location is made to flow along a line including the desired location.

A lyophilic pattern may be formed on the anode in order to increase wettability of a hole transport solution.

When a hole transport solution is ejected onto the lyophilic pattern using the nozzle printing method, force generated from air current created by the fast moving speed of the ejector may push the hole transport solution to one side of the lyophilic pattern. As a result, the hole transport solution may dry to have a non-uniform shape. This may cause the display to have non-uniform emission characteristics, and thus reduced display quality.

If the hole transport solution pushed to one side overflows to an adjacent pixel, the hole transport layer may be formed in part of the adjacent pixel. In this case, the organic light-emitting layer on the hole transport layer may also be formed in the part of the adjacent pixel. Therefore, organic light-emitting layers that emit light of different colors in adjacent pixels may overlap each other. This may cause an unwanted mixing of different color light, which also reduces display quality.

SUMMARY

In accordance with one or more embodiments, a light-emitting display device includes a first electrode; a pixel defining layer with an opening exposing the first electrode; a hole injection layer on the first electrode; a lyophilic pattern on the hole injection layer in the opening, the lyophilic pattern including a first part adjacent to a first sidewall of the opening and a second part adjacent to a second sidewall of the opening; a hole transport layer on the lyophilic pattern; a light-emitting layer on the hole transport layer; and a second electrode on the light-emitting layer, wherein a distance from a top surface of the hole injection layer to an edge of a top surface of the second part corresponds to a first height, a distance from the top surface of the hole injection layer to a top surface of the first part corresponds to a second height, and wherein the first height is lower than the second height.

The hole transport layer may correspond to a hole transport solution in a dried state, and a first contact angle of the hole transport solution relative to the edge of the second part may be greater than a second contact angle of the hole transport solution relative to the first part. A difference between the first contact angle and the second contact angle may be approximately 2 degrees or less. The second part of the lyophilic pattern may be connected to the first part, and the second part may include a sloping portion having a sloping top surface that becomes thinner from the first sidewall toward the second sidewall of the opening.

The second part of the lyophilic pattern may be connected to the first part and the second part may include a portion having a staircase-shaped top surface that becomes thinner from the first sidewall toward the second sidewall of the opening. The second part of the lyophilic pattern may be separated from the first part, the second part may include a plurality of lines which extend in a direction crossing a direction from the first sidewall toward the second sidewall of the opening, the lines may be separated from each other in the direction from the first sidewall toward the second sidewall, and the lines may become thinner from the first sidewall toward the second sidewall.

The second part of the lyophilic pattern may be separated from the first part, and the second part may include a plurality of dot patterns that become thinner from the first sidewall toward the second sidewall. The lyophilic pattern may include a third part between the first sidewall of the opening and the first part, and a height from the top surface of the hole injection layer to an edge of the third part may be lower than a height from the top surface of the hole injection layer to the top surface of the first part. The hole transport layer may include a first part adjacent to a third sidewall of the opening and a second part adjacent to a fourth sidewall of the opening, and a height from the first electrode to an edge of the first part may be lower than a height from the first electrode to an edge of the second part.

In accordance with one or more other embodiments, a light-emitting display device, comprising: a plurality of pixels; a plurality of first electrodes in respective ones of the pixels; a pixel defining layer with openings exposing respective ones of the first electrodes; a plurality of hole injection layers on respective ones of the first electrodes; a plurality of lyophilic patterns on respective ones of the hole injection layers in the openings, each of the lyophilic patterns including a first part adjacent to a first sidewall of a respective opening and a second part adjacent to a second sidewall of the respective opening; a plurality of hole transport layers on the lyophilic patterns; a plurality of light-emitting layers on respective ones of the hole transport layers; and a plurality of second electrodes on respective ones of the light-emitting layers.

The pixels are divided into a plurality of unit blocks, each of the unit blocks including a plurality of column groups arranged along a first direction, the unit blocks including a first unit block and a second unit block; and a boundary is between the first unit block and the second unit block. In each pixel, a distance from a top surface of the hole injection layer to an edge of a top surface of the second part of the lyophilic pattern, in a column group of the first unit block which faces the boundary, corresponds to a first height, a distance from the top surface of the hole injection layer to a top surface of the first part corresponds to a second height, and the first height is lower than the second height.

In each pixel, a distance from the top surface of the hole injection layer to the top surface of the second part of the lyophilic pattern of each pixel, in at least one column group of the first unit block excluding the column group which faces the boundary, may correspond to a first height, a distance from the top surface of the hole injection layer to the top surface of the first part may correspond to a second height, and the first height may be substantially equal to the second height.

In each pixel, the hole transport layer may include a dried hole transport solution, and a first contact angle of the hole transport solution with the edge of the second part of the lyophilic pattern of each pixel in the column group of the first unit block which faces the boundary may be greater than a second contact angle of the hole transport solution with the first part.

In each pixel, the second part of the lyophilic pattern of each pixel in the column group of the first unit block which faces the boundary may be connected to the first part, and the second part may include a sloping portion having a sloping top surface that becomes thinner from the first sidewall toward the second sidewall of the opening.

In each pixel, the second part of the lyophilic pattern of each pixel in the column group of the first unit block which faces the boundary may be connected to the first part, and the second part may include a staircase portion having a staircase-shaped top surface that becomes partially thinner from the first sidewall toward the second sidewall of the opening.

In each pixel, the second part of the lyophilic pattern of each pixel in the column group of the first unit block which faces the boundary may be separated from the first part the second part may include a plurality of lines extending in a direction crossing a direction from the first sidewall toward the second sidewall of the opening, the lines may be separated from each other in the direction from the first sidewall toward the second sidewall, and the lines become thinner from the first sidewall toward the second sidewall.

In each pixel, the second part of the lyophilic pattern of each pixel in the column group of the first unit block which faces the boundary may be separated from the first part, the second part may include a plurality of dot patterns, and the dot patterns may become thinner from the first sidewall toward the second sidewall.

In each pixel, the second part of the lyophilic pattern of each pixel in the column group of the first unit block which faces the boundary may include a third part between the first sidewall of the opening and the first part, and a height from the top surface of the hole injection layer to an edge of the third part may be lower than a height from the top surface of the hole injection layer to the top surface of the first part.

In accordance with one or more other embodiments, a method of fabricating a light-emitting display device includes forming a first electrode in each of a plurality of pixels, the pixels arranged in first and second directions that cross each other; forming a pixel defining layer including a plurality of openings that respectively expose the first electrodes of corresponding pixels; forming a hole injection layer on the first electrode; forming a lyophilic pattern including a first part adjacent to a first sidewall of the opening and a second part adjacent to a second sidewall of the opening; forming a hole transport layer on the lyophilic pattern; forming a light-emitting layer on the hole transport layer; and forming a second electrode on the light-emitting layer, wherein the lyophilic pattern is formed such that a height from a top surface of the hole injection layer to an edge of a top surface of the second part is lower than a height from the top surface of the hole injection layer to a top surface of the first part.

Forming the lyophilic pattern may include forming a lyophilic material layer by coating a lyophilic solution on the hole injection layer; placing a pattern mask above the lyophilic material layer and irradiating light on the pattern mask, the pattern mask including a blocking region, a transmitting region and a semi-transmitting region; forming the first part of the lyophilic pattern using a part of the lyophilic material layer which corresponds to the transmitting region of the pattern mask; and forming the second part of the lyophilic pattern using a part of the lyophilic material layer which corresponds to the semi-transmitting region of the pattern mask, forming the second part including leaving an exposed part of the lyophilic material layer through a development process. The blocking region may be placed to correspond to a top surface of the pixel defining layer, the transmitting region may be placed to correspond to a part of the lyophilic material layer which overlaps the first electrode and is adjacent to the first sidewall of the opening in the first direction, and the semi-transmitting region may be placed to correspond to a part of the lyophilic material layer which overlaps the first electrode and is adjacent to the second sidewall of the opening.

The amount of exposure of the part of the lyophilic material layer which corresponds to the semi-transmitting region may be smaller than the amount of exposure of the part of the lyophilic material layer which corresponds to the transmitting region, and the amount of exposure of the part of the lyophilic material layer which corresponds to the semi-transmitting region may decrease from the first sidewall toward the second sidewall of the opening.

BRIEF DESCRIPTION OF THE DRAWINGS

Features will become apparent to those of in the art by describing in detail exemplary embodiments with reference to the attached drawings in which:

FIGS. 16 to 30 illustrate different stages of an embodiment of a method for fabricating a light-emitting display device.

DETAILED DESCRIPTION

Figure 1:
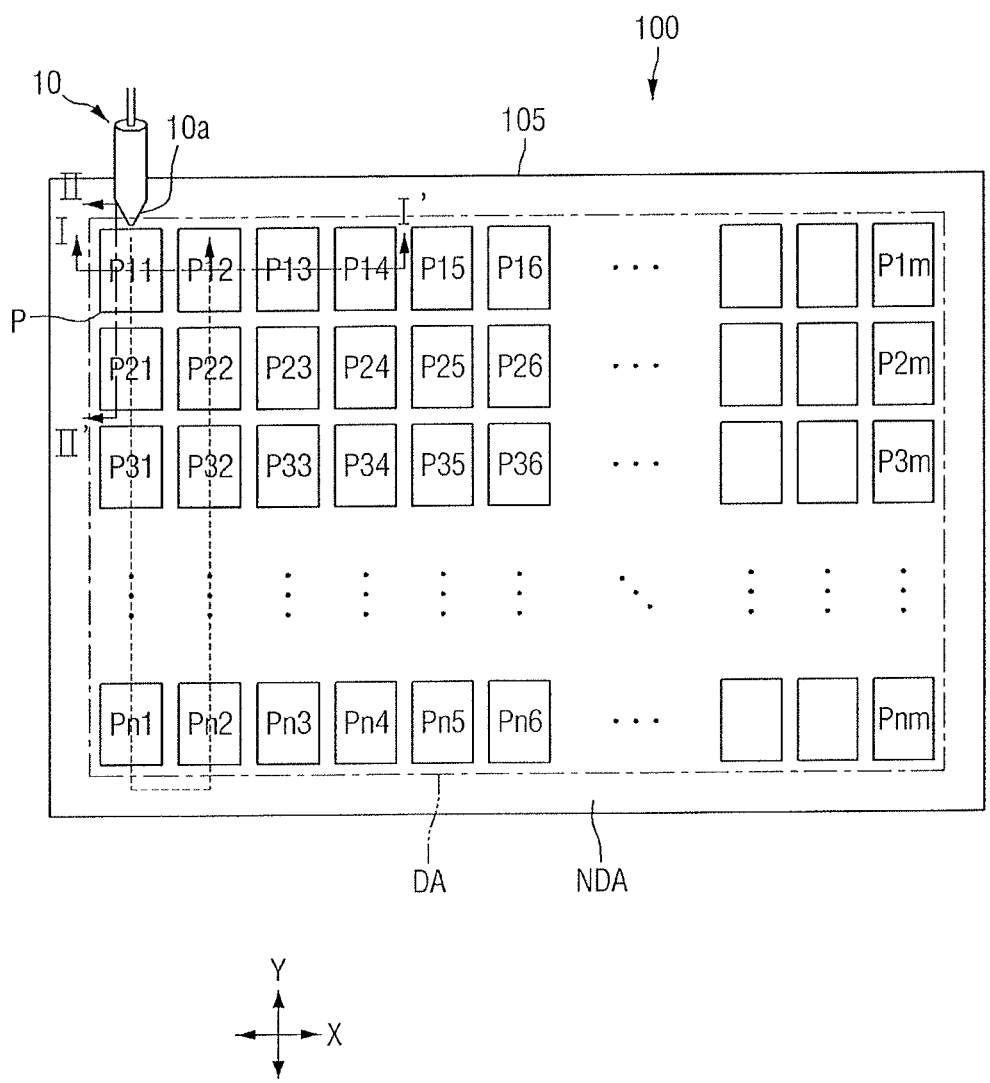
FIG. 1 illustrates an embodiment of a light-emitting display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
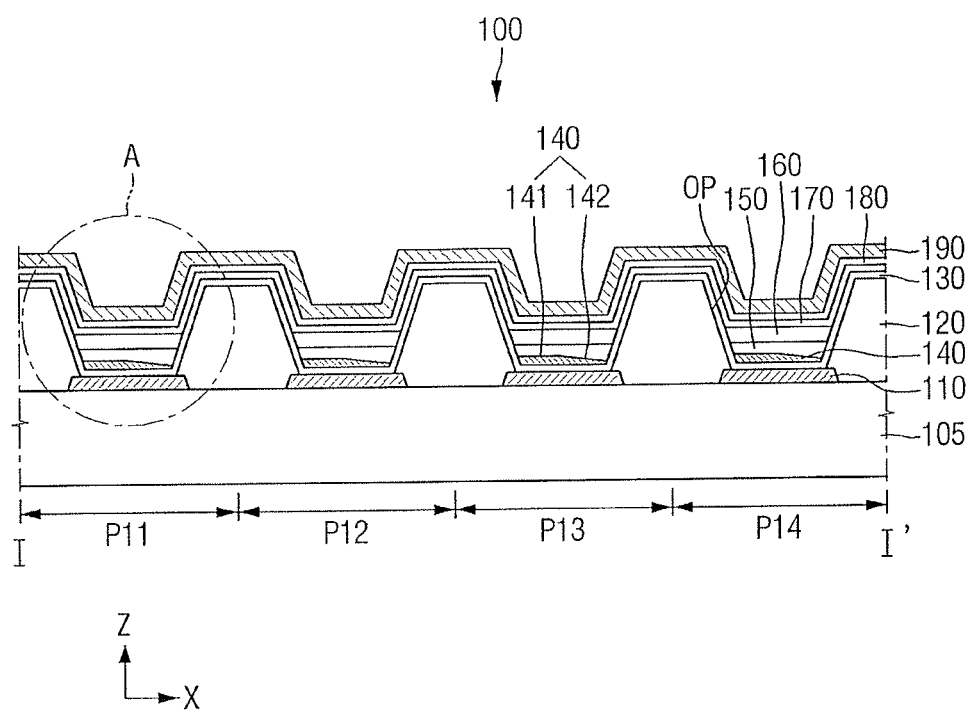
FIG. 2 illustrates a cross-sectional view taken along the line I-I' in FIG. 1.
Figure 3:
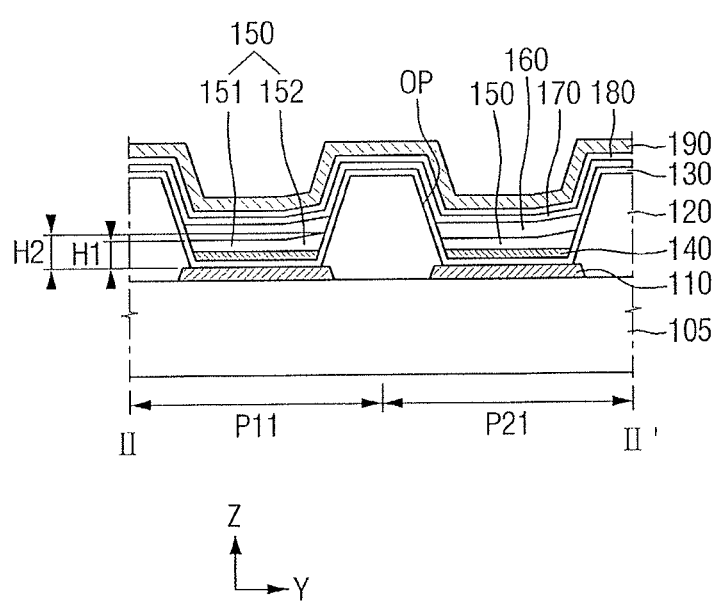
FIG. 3 illustrates a cross-sectional view taken along the line II-II' in FIG. 1.

FIG. 1 illustrates an embodiment of a light-emitting display device 100 including a plurality of pixels P. FIG. 2 is a cross-sectional view taken along line I-I' in FIG. 1. FIG. 3 is a cross-sectional view taken along line II-II' in FIG. 1.

Referring to FIGS. 1 to 3, the light-emitting display device 100 includes a substrate 105, a first electrode 110, a pixel defining layer 120, a hole injection layer 130, a lyophilic pattern 140, a hole transport layer 150, a light-emitting layer 160, an electron transport layer 170, an electron injection layer 180, and a second electrode 190. These elements are stacked sequentially in a third direction (Z) in FIG. 2.

The substrate 105 includes a display area DA and a non-display area NDA. The pixels P for display images are in the display area DA. The non-display area NDA is outside of the display area DA.

The pixels P may be arranged in a matrix of n×m along a first direction (X) and a second direction (Y) intersecting the first direction X. The pixels P may include red pixels which emit red light, green pixels which emit green light, and blue pixels which emit blue light. In an example, pixels PX emitting different colors of light may be alternately arranged along the first direction X. Pixels P emitting the same color light may be arranged along the second direction Y. This arrangement may be different in another embodiment.

The pixels P may be divided into a plurality of row groups on the substrate 105 along the second direction Y. The row groups may include first to $n^{th}$ row groups Pn1, Pn2, ..., Pnm. In addition, the pixels P may be divided into a plurality of column groups on the substrate 105 along the first direction X. The column groups may include first to $n^{th}$ column groups P1m, P2m, ..., Pnm.

The substrate 105 may include an insulating substrate made of, for example, a transparent glass material containing $SiO_2$. In some embodiments, the insulating substrate may be made of an opaque material or a plastic material. Further, the insulating substrate may be a flexible substrate.

The substrate 105 may further include other structures formed on the insulating substrate. Examples include wirings, electrodes, and/or insulating layers. In some embodiments, the substrate 105 may include a plurality of thin-film transistors (TFTs) on the insulating substrate. Each TFT may have a drain electrode electrically connected to a first electrode 110, and an active regions made, for example, of amorphous silicon, polycrystalline silicon, or monocrystalline silicon. In another embodiment, each TFT may include an active region made of an oxide semiconductor. The TFTs may have different configurations in another embodiment.

The first electrode 110 is formed on the substrate 105 in each pixel P. The first electrode 110 may be an anode which provides holes to the light-emitting layer 160 in response to a signal transmitted to a corresponding TFT, or a cathode which provides electrons to the light-emitting layer 160 in response to the signal transmitted to the TFT. In the current embodiment, a case where the first electrode 110 is an anode will be described as an example.

The first electrode 110 may be used as a transparent electrode, a reflective electrode, or a transflective electrode. To be used as a transparent electrode, the first electrode 110 may be formed, for example, of indium tin oxide (ITO), indium zinc oxide (IZO), zinc oxide (ZnO), or $In_2O_3$. To be used as a reflective electrode, the first electrode 110 may be formed, for example, by forming a reflective layer using Ag, Mg, Al, Pt, Pd, Au, Ni, Nd, Ir, Cr, or a compound of the same, and then forming ITO, IZO, ZnO or $In_2O_3$ on the reflective layer. To be used as a transflective electrode, the first electrode 110 may be formed, for example, by forming a thin reflective layer using Ag, Mg, Al, Pt, Pd, Au, Ni, Nd, Ir, Cr, or a compound of the same, and then forming ITO, IZO, ZnO or $In_2O_3$ on the thin reflective layer. The first electrode 110 may be formed, for example, by a photolithography method.

When the first electrode 110 is a transparent electrode, the light-emitting display device 100 may be a bottom emission light-emitting display device (e.g., one in which light generated by the light-emitting layer 160 is emitted toward the first electrode 110). When the first electrode 110 is used as a reflective electrode, the light-emitting display device 100 may be a top emission light-emitting display device (e.g., one in which light generated by the light-emitting layer 160 is emitted toward the second electrode 190).

The pixel defining layer 120 is on the substrate 105 and includes a plurality of openings OP. Each opening exposes a respective one of the first electrodes 110 of pixels P. The opening, thus, defines each pixel P on the substrate 105. The pixel defining layer 120 may be made, for example, of an insulating material. In one embodiment, the pixel defining layer 120 may be made of at least one organic material selected from the group consisting of benzocyclobutene (BCB), polyimide (PI), polyamide (PA), acrylic resin, and phenolic resin. In another example, the pixel defining layer 120 may be made of an inorganic material such as silicon nitride. The pixel defining layer 120 may be formed for example, by a photolithography process.

The hole injection layer 130 may be on the first electrode 110 exposed through the opening OP of the pixel defining layer 120, and may entirely cover the pixel defining layer 120. The hole injection layer 130 may be a buffer layer that lowers an energy barrier between the first electrode 110 and the hole transport layer 150. The hole injection layer 130 facilitates injection of holes from the first electrode 110 into the hole transport layer 150. The hole injection layer 130 may be made, for example, of an organic compound such as but not limited to 4,4',4"-tris(3-methylphenylphenylamino) triphenylamine (MTDATA), copper phthalocyanine (CuPc), or poly(3,4-ethylenedioxythiophene)/polystyrene sulfonate (PEDOT/PSS). The hole injection layer 130 may be formed, for example, by slit coating.

The lyophilic pattern 140 is on the hole injection layer 130 in each pixel P. For example, the lyophilic pattern 140 may be disposed on the hole injection layer 130 inside the opening OP of the pixel defining layer 120. The lyophilic pattern 140 may be formed, for example, by a photolithography process.

The lyophilic pattern 140 may be made of a lyophilic material that causes the lyophilic pattern 140 to be more lyophilic to a hole transport solution 150a (see, e.g., FIG. 5) than the pixel defining layer 120, e.g., a lyophilic material that causes a contact angle of the hole transport solution 150a with the lyophilic pattern 140 to be less than a contact angle with the hole transport solution 150a to the pixel defining layer 120.

In one embodiment, the lyophilic pattern 140 may be made of conductive primer that causes the contact angle of the hole transport solution 150a with the lyophilic pattern 140 to be approximately 10 degrees or less. In this case, when the hole transport solution 150a is ejected onto the lyophilic pattern 140 inside the opening OP of the pixel defining layer 120 in each pixel P using a nozzle printing method, the hole transport solution 150a may be stably within a corresponding pixel P, instead of spreading onto the top surface of the pixel defining layer 120, due to high wettability of the hole transport solution 150a to the lyophilic pattern 140. Accordingly, the hole transport layer 150 may be formed uniformly on the lyophilic pattern 140. In at least one embodiment, high wettability may denote that a liquid is spread widely over the surface of a solid, to thereby contact a wide area of the surface.

As illustrated in FIG. 2, the lyophilic pattern 140 includes a first part 141 and a second part 142. The first part 141 may be adjacent to a first sidewall of each opening OP, among first and second sidewalls which face each other in the first direction X. The second part 142 may be adjacent to the second sidewall of each opening OP.

As illustrated in FIG. 3, the hole transport layer 150 is formed on the lyophilic pattern 140 and includes a first part 151 and a second part 152. The first part 151 may be adjacent to a third sidewall of each opening OP, from among third and fourth sidewalls of each opening OP which face each other in the second direction Y. The second part 152 may be adjacent to the fourth sidewall of each opening OP. A height H1 from the first electrode 110 to an edge of the first part 151 may be lower than a height H2 from the first electrode 110 to an edge of the second part 152.

For example, when the hole transport solution 150a (see, e.g., FIG. 5) is ejected onto the lyophilic pattern 140 inside the opening OP of the pixel defining layer 120 in each pixel P using a nozzle printing method, force generated from air current created by the fast moving speed of an ejector 10 (see FIG. 1) is applied in a direction in which the ejector 10 moves from the second direction Y. This force causes the hole transport solution 150a to contact the fourth sidewall of the opening OP up to a high location and to be dried accordingly. This is why the height H1 from the first electrode 110 to the edge of the first part 151 is lower than the height H2 from the first electrode 110 to the edge of the second part 152.

However, the height H1 from the first electrode 110 to the edge of the part 151 of the hole transport layer 150 may not be greatly different from the height H2 from the first electrode 110 to the edge of the part 152 of the hole transport layer 150. Therefore, the difference between the height H1 and the height H2 may not greatly contribute to a reduction in emission characteristics of the light-emitting display device 100.

The hole transport layer 150 receives holes from the hole injection layer 130 via the lyophilic pattern 140. The hole transport layer 150 transports holes from the hole injection layer 130, via the lyophilic pattern 140, to the light-emitting layer 160. The hole transport layer 150 may be made, for example, of an organic compound, such as but not limited to N,N'-diphenyl-N,N'-bis(3-methylphenyl)-1,1'-bi-phenyl-4, 4'-diamine (TPD) or N,N'-di(naphthalen-1-yl)-N,N'-diphenyl-benzidine (NPB). The hole transport layer 150 may be formed, for example, using a nozzle printing method, which is effective for forming a thin film uniformly.

The light-emitting layer 160 is formed on the hole transport layer 150. The light-emitting layer 160 emits light when holes from the first electrode 110 recombine with electrons from the second electrode 190, e.g., holes and electrons provided to the light-emitting layer 160 combine to form excitons. When the excitons change from an excited state to a ground state, the light-emitting layer 160 emits light.

The light-emitting layer 160 may include a red light-emitting layer which emits red light, a green light-emitting layer which emits green light, and a blue light-emitting layer which emits blue light. The light-emitting layer 160 may be formed, for example, using an inkjet printing method or a nozzle printing method.

The red light-emitting layer may include, for example, one red light-emitting material or a host and a red dopant. Examples of the host of the red light-emitting layer include, but not limited to, tris(8-quinolinorate)aluminum ($Alq_3$), 4,4'-N,N'-dicarbazol-biphenyl (CBP), ploy(n-vinylcarbazole) (PVK), 9,10-Di(naphthyl-2-yl)anthracene (ADN), 4,4', 4"-tris(N-carbazolyl)triphenylamine (TCTA), 1,3,5-tris(N-phenylbenzimidazole-2-yl)benzene (TPBI), 3-tert-butyl-9, 10-di(naphth-2-yl) anthracene (TBADN), ter-fluorene (E3), and distyrylarylene (DSA). Examples of the red dopant may include, but are not limited to, PtOEP. $Ir(piq)_3$ and $Btp_2Ir$ (acac).

The green light-emitting layer may include, for example, one green light-emitting material or a host and a green dopant. The host of the red light-emitting layer may be used as the host of the green light-emitting layer. Examples of the green dopant include, but are not limited to, $Ir(ppy)_3$, $Ir(ppy)_2(acac)$, and $Ir(mpyp)_3$.

The blue light-emitting layer may include, for example, one blue light-emitting material or a host and a blue dopant.

The host of the red light-emitting layer may be used as the host of the blue light-emitting layer. Examples of the blue dopant include, but are not limited to, $F_2$Irpic, $(F_2ppy)_2$Ir (tmd), Ir(dfppz)$_3$, ter-fluorene (E3), 4,4'-bis(4-di-p-tolylaminostyryl) biphenyl (DPAVBi), and 2,5,8,11-tetra-tert-butyl perylene (TBPe).

The electron transport layer 170 is disposed on the light-emitting layer 160 and receives electrons from the second electrode 190 via the electron injection layer 180. The electron transport layer 170 transports electrons from the second electrode 190, via the electron injection layer 180, to the light-emitting layer 160. The electron transport layer 170 may be made, for example, of an organic compound such as, but not limited to, 4,7-diphenyl-1,10-phenanthroline (Bphen), aluminum(III)bis(2-methyl-8-hydroxyquinolinato)4-phenylphenolate (BAlq), tris(8-quinolinolato)aluminum (Alq$_3$), berylliumbis (benzoquinolin-10-olate) (Bebq$_2$), or 1,3,5-tris(N-phenylbenzimidazole-2-yl)benzene (TPBI). The electron transport layer 170 may be formed, for example, by a deposition process.

The electron injection layer 180 is formed on the electron transport layer 170 and receives electrons from the second electrode 190. The electron injection layer 180 is a buffer layer that lowers an energy barrier between the electron transport layer 170 and the second electrode 190. The electron injection layer 180 facilitates injection of electrons from the second electrode 190 into the electron transport layer 170. The electron injection layer 180 may be made, for example, of LiF or CsF. The electron injection layer 180 may be formed, for example, by a deposition process.

The second electrode 190 is formed on the electron injection layer 180 and may be a cathode providing electrons to the light-emitting layer 160 or an anode providing holes to the light-emitting layer 160. In the current embodiment, a case where the second electrode 190 is a cathode will be described as an example. Like the first electrode 110, the second electrode 190 may be used as a transparent electrode or a reflective electrode. The second electrode 190 may be formed, for example, by a deposition process.

The light-emitting display device 100 may further include an encapsulation substrate on the second electrode 190. The encapsulation substrate may be made, for example, of an insulating substrate. A spacer may be between the second electrode 190 on the pixel defining layer 120 and the encapsulation substrate. In one embodiment, the encapsulation substrate may be omitted. In this case, an encapsulation layer made of an insulating material may cover and thus protect the entire structure.

Figure 4:
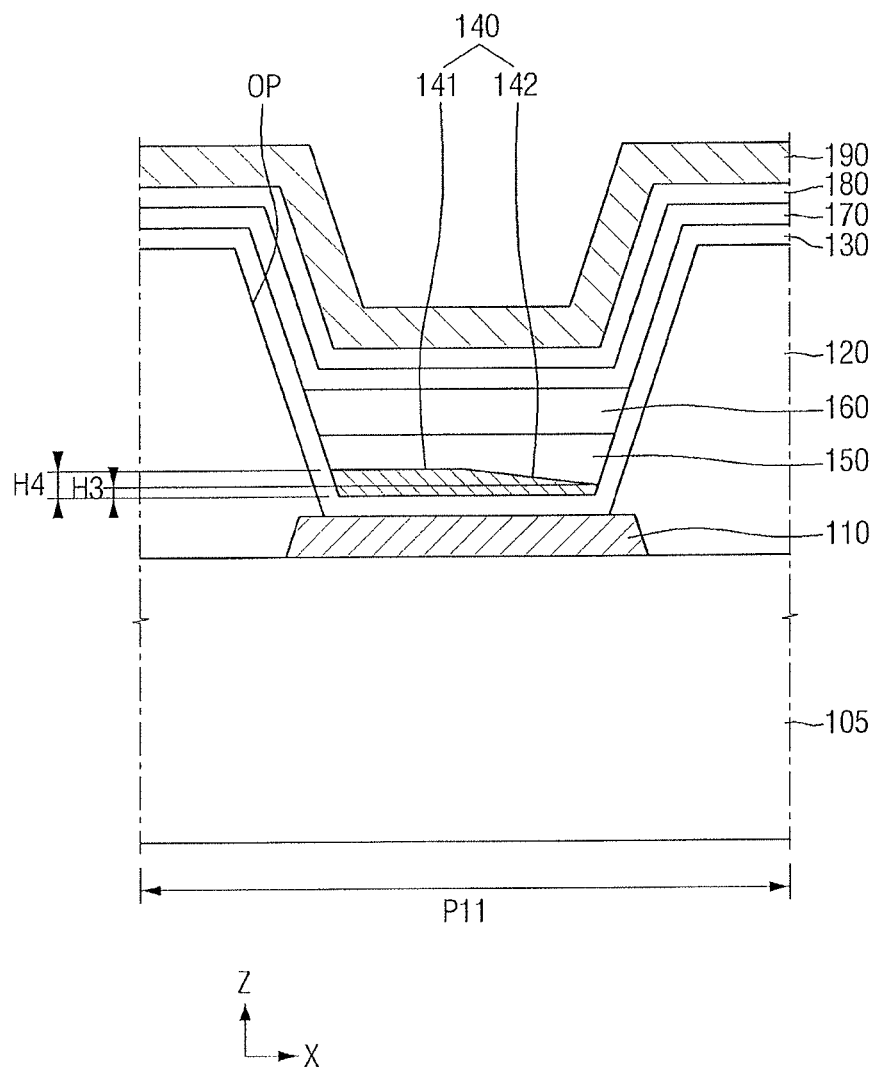
FIG. 4 illustrates an enlarged cross-sectional view of portion A in FIG. 2.
Figure 5:
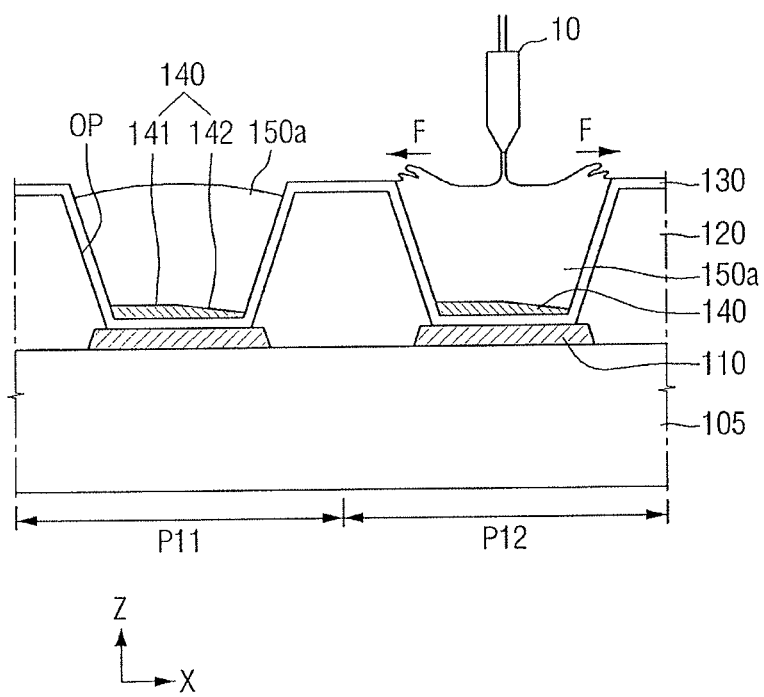
FIG. 5 illustrates an example of the state of a hole transport solution in adjacent pixels when the hole transport solution is ejected.

FIG. 4 is an enlarged cross-sectional view of portion A in FIG. 2. FIG. 5 illustrates an example of a state of the hole transport solution 150a in adjacent pixels when the hole transport solution 150a is ejected.

Referring to FIG. 4. the lyophilic pattern 140 may include the first part 141 adjacent to the first sidewall of an opening OP and the second part 142 adjacent to the second sidewall of the opening OP. The first part 141 may have a flat portion or area having a flat top surface. The second part 142 may be connected to the first part 141 and may have a sloping portion or area having a sloping top surface that becomes thinner from the first sidewall toward the second sidewall of the opening OP. An average thickness of the first part 141 may be different from that of the second part 142.

In addition, the height H3 from a top surface of the hole injection layer 130 to an edge of the top surface of the second part 142 may be lower than a minimum height H4 from the top surface of the hole injection layer 130 to the top surface of the first part 141. Since the top surface of the first part 141 is flat, a height from the top surface of the hole injection layer 130 to the top surface of the first part 141 may be the same at any location on the first part 141.

Referring to FIG. 5, when the hole transport solution 150a is ejected from the ejector 10 onto the lyophilic pattern 140 of a pixel P12 using a nozzle printing method, the resistance of the hole transport solution 150a to a force F generated from air current created by the fast moving speed of the ejector 10 may increase as a result of the sloping second part 142 of the lyophilic pattern 140 of a pixel P11. The increased resistance may reduce or prevent the hole transport solution 150a, already ejected onto the lyophilic pattern 140 of the pixel P11, from being pushed to one side (e.g., toward the first sidewall of the opening OP) within the opening OP. This may prevent the hole transport solution 150a from drying to a greater degree at this one side (e.g., in a non-uniform shape) and/or may prevent the hole transport solution 150a from overflowing to another pixel. Thus, the shape of the hole transport layer 150 formed by drying the hole transport solution 150a ejected onto the lyophilic pattern 140 of the pixel P11 may be uniform.

The hole transport layer 150 may be formed as the hole transport solution 150a ejected onto the lyophilic pattern 140 of the pixel P11 dries, while being within in the opening OP of the pixel P11. The ejector 10, which ejects the hole transport solution 150a using the nozzle printing method, may include a nozzle 10a (see, e.g., FIG. 1). This nozzle may move, for example, from the pixel P11 toward the pixel P12 via a pixel P21, e.g., see the dotted line in FIG. 1. The nozzle 10a may move in a different manner or direction in another embodiment.

In FIG. 4, the thickness of the hole transport layer 150 is not uniform. Therefore, it can be understood that the non-uniform thickness of the hole transport layer 150 may affect emission characteristics of the light-emitting display device 100. However, since the lyophilic pattern 140 is substantially very thin, the thickness of the hole transport layer 150 may be almost uniform without being greatly affected by the shape of the lyophilic pattern 140, which includes the first part 141 having the flat portion and the second part 142 having the sloping portion.

The lyophilic pattern 140 may be formed to have this structure, for example, by a negative photolithography method, e.g., by coating a lyophilic material on the hole injection layer 130, exposing the lyophilic material to light using a pattern mask, and leaving an exposed portion of the lyophilic material on the hole injection layer 130. The thickness of the lyophilic pattern 140, formed of the lyophilic material remaining on the hole injection layer 130, may be controlled by the amount of exposure to light.

For example, as the amount of exposure of the lyophilic material increases, the thickness of the lyophilic pattern 140 may increase. Due to this principle, the amount of exposure of the lyophilic material that forms the second part 142 having the sloping portion with the sloping top surface (e.g., the amount of exposure of the lyophilic material adjacent to the second sidewall of the opening OP) may be less than the amount of exposure of the lyophilic material adjacent to the first sidewall of the opening OP. The amount of exposure of the lyophilic material may be reduced from the first sidewall of the opening OP toward the second sidewall.

The smaller the amount of exposure of the lyophilic material, the greater the contact angle of the hole transport solution 150a with the lyophilic pattern 140. For example, the contact angle of the hole transport solution 150a with the second part 142 may be greater than the contact angle of the hole transport solution 150a with the first part 141. In one embodiment, a first contact angle of the hole transport solution 150a with an edge of the second part 142 may be approximately 5 degrees or less. A second contact angle of the hole transport solution 150a with the first part 141 may be approximately 4 degrees or less. The difference between the first contact angle and the second contact angle may be approximately 2 degrees of less. Spreading of the hole transport solution 150a may be reduced in areas where the contact angle of the hole transport solution 150a is large. Accordingly, the hole transport solution 150a tends to remain stationary in this part.

Due to this characteristic, when the hole transport solution 150a is ejected from the ejector 10 onto the lyophilic pattern 140 of the pixel P12 using a nozzle printing method (e.g., as illustrated in FIG. 5), the resistance of the hole transport solution 150a to the force F generated from air current created by the fast moving speed of the ejector 10 may be further increased by the first contact angle, when the first contact angle is greater than the second contact angle. Since the first contact angle is greater than the second contact angle, it can be understood that the hole transport solution 150a may not be spread properly over the entire inside of the opening OP. However, since the difference between the first contact angle and the second contact angle is not great (e.g., less than a predetermined difference), it may not greatly affect the spreading of the hole transport solution 150a over the entire inside the opening OP.

FIGS. 6 to 11 illustrate various embodiments of the lyophilic pattern 140.

Figure 6:
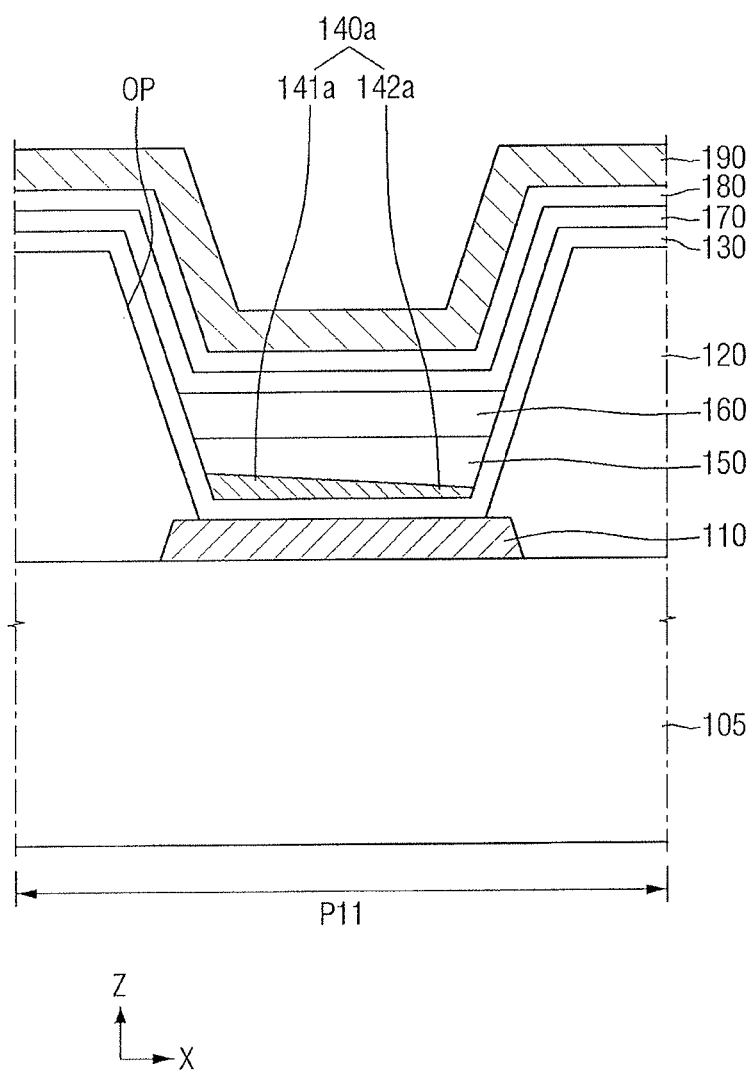
FIGS. 6 through 11 illustrate various embodiments of a lyophilic pattern.

Referring to FIG. 6, a lyophilic pattern 140a may include a first part 141a including a sloping portion and a second part 142a including a sloping portion. The sloping portion of the first part 141a has a sloping top surface that becomes thinner from a first sidewall toward a second sidewall of an opening OP. The sloping portion of the second part 142a also becomes thinner in this direction. The sloping portions of the first and second parts 141a and 142a may form a continuous sloping surface between the sidewalls.

The lyophilic pattern 140a is applied onto the hole injection layer 130 of each of the pixels P11 and P12 of FIG. 5. When the hole transport solution 150a is ejected from the ejector 10 onto the lyophilic pattern 140a of the pixel P12 using a nozzle printing method, the resistance of the hole transport solution 150a to a force F generated from air current created by the fast moving speed of the ejector 10 may further be increased by the sloping second part 142a and the sloping first part 141a of the lyophilic pattern 140a of the pixel P11. The increased resistance may reduce or prevent the hole transport solution 150a, already ejected onto the lyophilic pattern 140a of the pixel P11, from being pushed to one side within the opening OP and then remaining in this state or from overflowing to another pixel. As a result, the shape of the hole transport layer 150, formed by drying the hole transport solution 150a ejected onto the lyophilic pattern 140a of the pixel P11, may be uniform. The hole transport layer 150 may be formed as the hole transport solution 150a ejected onto the lyophilic pattern 140a of the pixel P11 is dried, while being within in the opening OP of the pixel P11.

Figure 7:
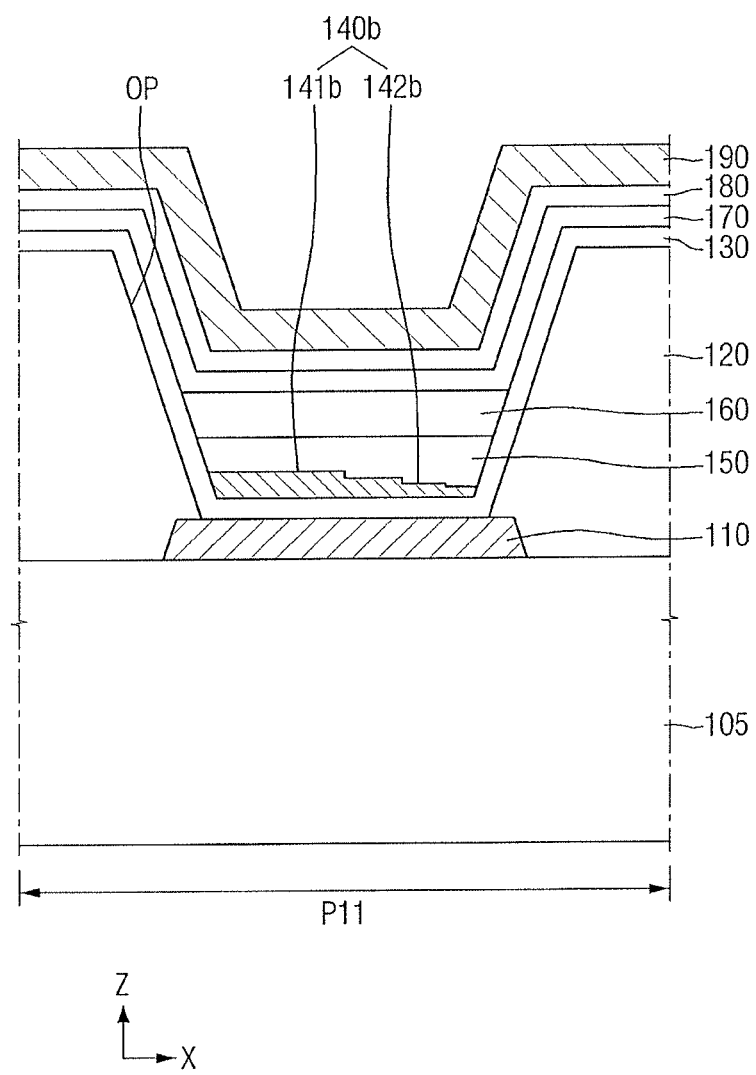

Referring to FIG. 7, a lyophilic pattern 140b may include a first part 141b including a flat portion and a second part 142b including a staircase or stepped portion. The first part 141b may be the same as the first part 141 of FIG. 4. The second part 142b may include a staircase portion having a top surface with a stepped-shaped that becomes thinner in a direction from a first sidewall toward a second sidewall of an opening OP. The staircase portion may increase the resistance of a hole transport solution 150a to an external force and, for example, may be formed by adjusting the amount of exposure of a lyophilic material for forming the lyophilic pattern 140b.

The lyophilic pattern 140b may be applied onto the hole injection layer 130 of each of the pixels P11 and P12 of FIG. 5. When the hole transport solution 150a is ejected from the ejector 10 onto the lyophilic pattern 140b of the pixel P12 using a nozzle printing method, the resistance of the hole transport solution 150a to a force F generated from air current created by the fast moving speed of the ejector 10 may further be increased by the staircase-shaped second part 142b of the lyophilic pattern 140b of the pixel P11. The increased resistance may reduce or prevent the hole transport solution 150a, already ejected onto the lyophilic pattern 140b of the pixel P11, from being pushed to one side within the opening OP and then remaining in this state or from overflowing to another pixel. As a result, the shape of the hole transport layer 150, formed by drying the hole transport solution 150a ejected onto the lyophilic pattern 140b of the pixel P11, may be uniform. The hole transport layer 150 may be formed as the hole transport solution 150a ejected onto the lyophilic pattern 140b of the pixel P11 is dried, while being within in the opening OP of the pixel P11.

Figure 8:
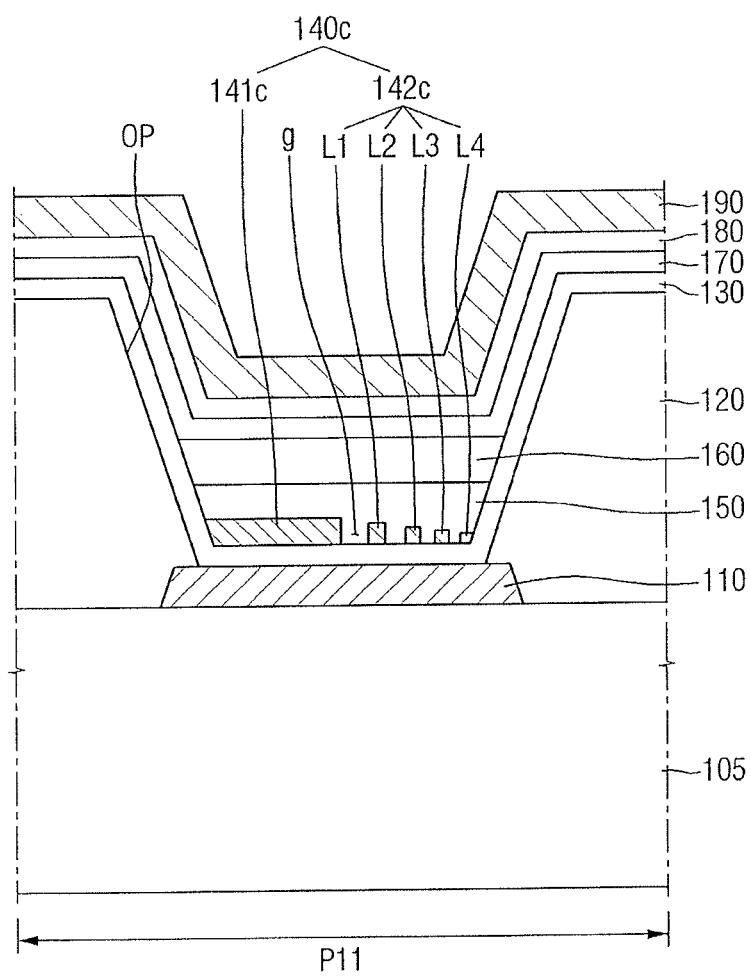
Figure 9:
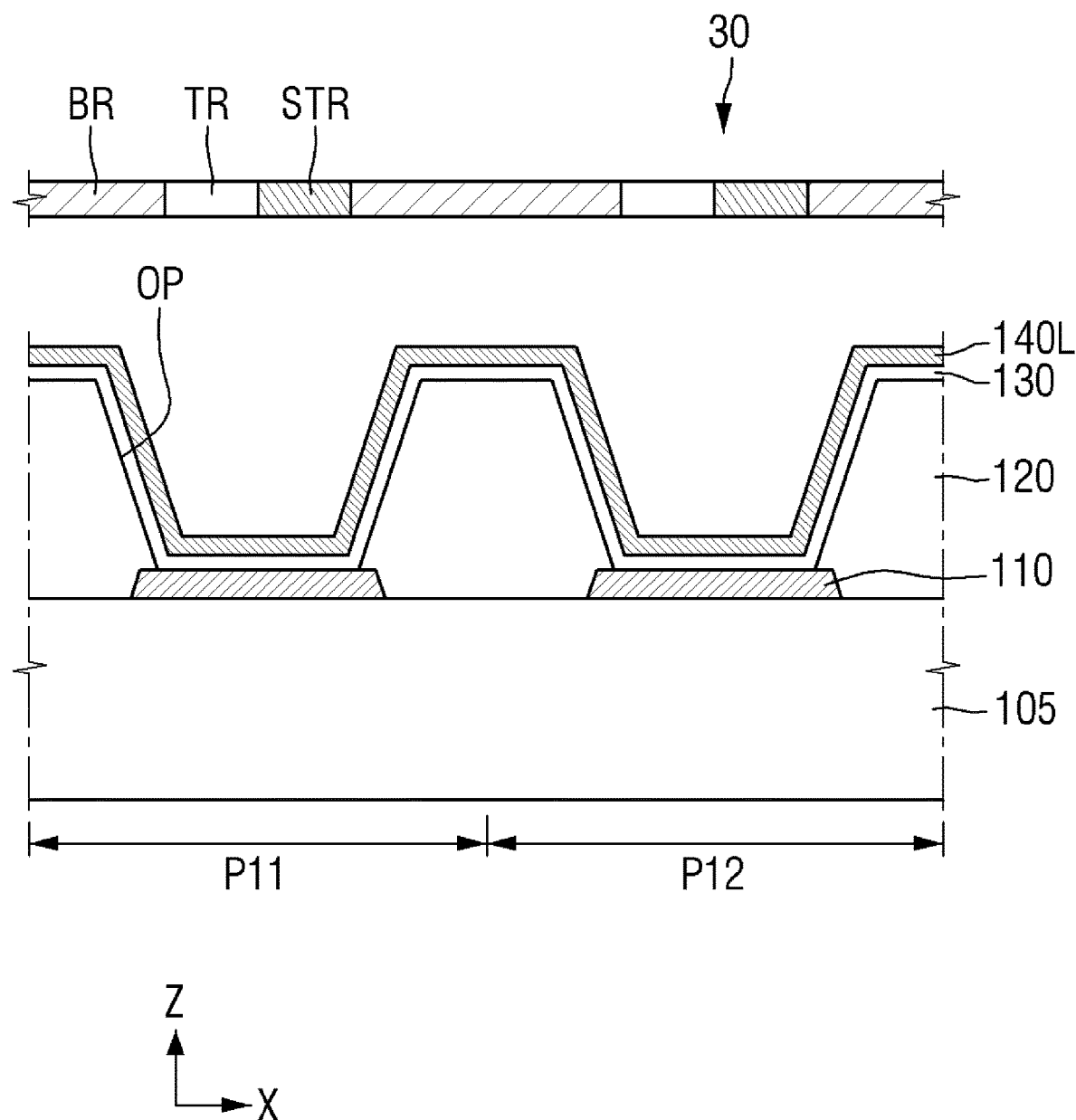

Referring to FIGS. 8 and 9, a lyophilic pattern 140c include a first part 141c including a flat portion and a second part 142c including a plurality of lines L1 to L4. The first part 141c may be the same as the first part 141 of FIG. 4. The lines L1 to L4 of the second part 142c extend in a direction (e.g., a Y direction) crossing or perpendicular to a direction (e.g., an X direction) from a first sidewall toward a second sidewall of an opening OP and are separated from each other in the direction (e.g., the X direction) from the first sidewall toward the second sidewall. The lines L1 to L4 become thinner from the first sidewall toward the second sidewall of the opening OP. A plurality of grooves g1 between the lines L1 through L4 become narrower from the first sidewall toward the second sidewall.

The lines L1 to L4 and the grooves g1 between the lines L1 to L4 may increase the resistance of the hole transport solution 150a to an external force, and may be formed, for example, by adjusting the amount of exposure of a lyophilic material for forming the lyophilic pattern 140c.

The lyophilic pattern 140c is applied onto the hole injection layer 130 of each of the pixels P11 and P12 of FIG. 5. When the hole transport solution 150a is ejected from the ejector 10 onto the lyophilic pattern 140c of the pixel P12 using a nozzle printing method, the resistance of the hole transport solution 150a to a force F generated from air current created by the fast moving speed of the ejector 10 may further be increased by the second part 142c (including the lines L1 through L4 and the grooves g1 between the lines L1 through L4) of the lyophilic pattern 140c of the pixel P11. The increased resistance may reduce or prevent the hole transport solution 150a, already ejected onto the lyophilic pattern 140c of the pixel P11, from being pushed to one side within the opening OP and then remaining in this state or from overflowing to another pixel. As a result, the shape of the hole transport layer 150, formed by drying the hole transport solution 150a ejected onto the lyophilic pattern 140c of the pixel P11, may be uniform. The hole transport layer 150 may be formed as the hole transport solution 150a ejected onto the lyophilic pattern 140c of the pixel P11 is dried, while being within in the opening OP of the pixel P11.

Figure 10:
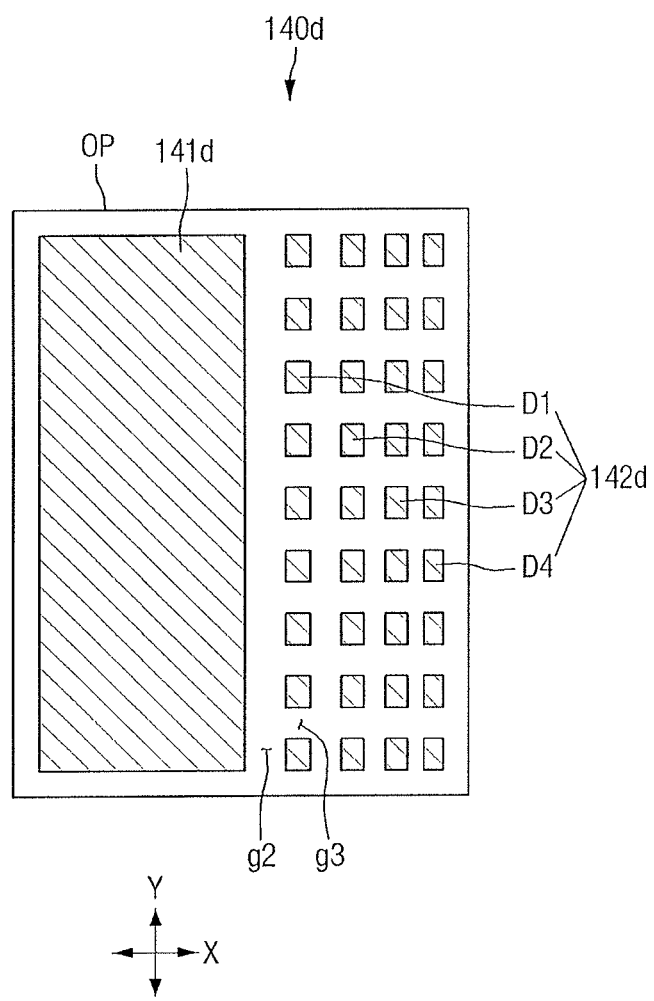

Referring to FIG. 10, a lyophilic pattern 140d may include a first part 141d including a flat portion and a second part 142d including a plurality of dot patterns D1 through D4. The first part 141d may be the same as the first part 141 of FIG. 4. The dot patterns D1 through D4 of the second part 142d may become thinner in a direction (e.g., an X direction) from a first sidewall toward a second sidewall of an opening OP. First grooves g2 may intersect second grooves g3 and may be between the dot patterns D1 through D4. The widths of the first grooves g2 may be reduced in the direction (e.g., the X direction) from the first sidewall toward the second sidewall of the opening OP. The widths of the second grooves g3 may be the same in the direction (e.g., a Y direction) perpendicular to or crossing the direction from the first sidewall toward the second sidewall of the opening OP.

The dot patterns D1 through D4 and the grooves g2 and g3 may increase the resistance of the hole transport solution 150a to external force and, for example, may be formed by adjusting the amount of exposure of a lyophilic material for forming the lyophilic pattern 140d.

The lyophilic pattern 140d is applied onto the hole injection layer 130 of each of the pixels P11 and P12 of FIG. 5. When the hole transport solution 150a is ejected from the ejector 10 onto the lyophilic pattern 140d of the pixel P12 using a nozzle printing method, the resistance of the hole transport solution 150a to a force F generated from air current created by the fast moving speed of the ejector 10 may further be increased by the second part 142d (including the dot patterns D1 through D4 and the grooves g2 and g3) of the lyophilic pattern 140d of the pixel P11. The increased resistance may reduce or prevent the hole transport solution 150a, already ejected onto the lyophilic pattern 140d of the pixel P11, from being pushed to one side within the opening OP and then remaining in this state or from overflowing to another pixel. As a result, the shape of the hole transport layer 150, formed by drying the hole transport solution 150a ejected onto the lyophilic pattern 140d of the pixel P11, may be uniform. The hole transport layer 150 may be formed as the hole transport solution 150a ejected onto the lyophilic pattern 140d of the pixel P11 is dried, while being within in the opening OP of the pixel P11.

Figure 11:
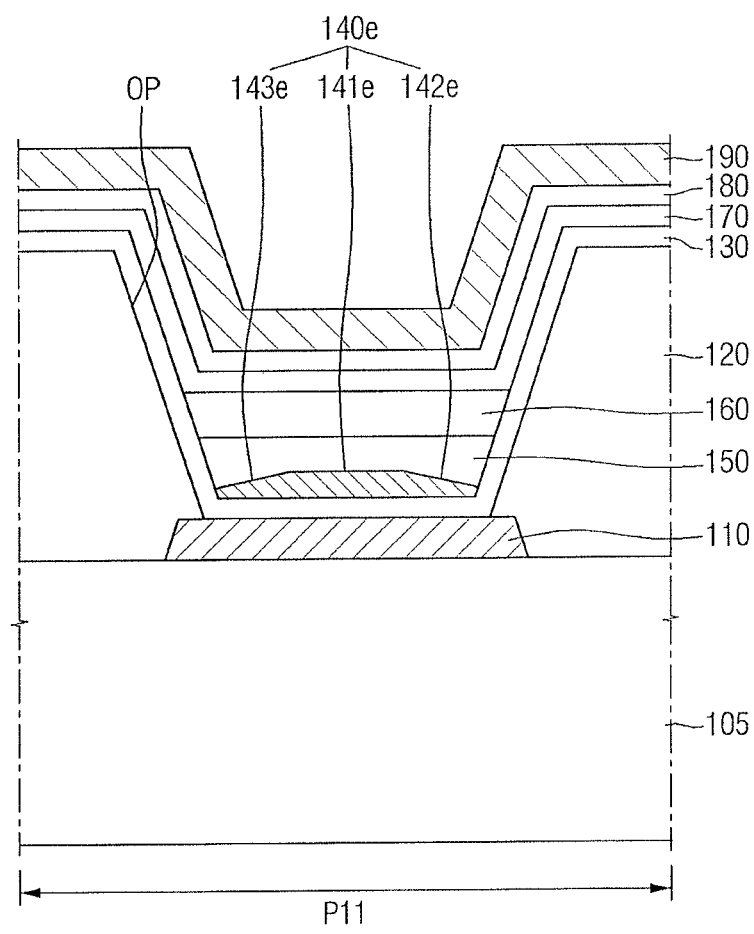

Referring to FIG. 11, a lyophilic pattern 140e includes a first part 141e, a second part 142e, and a third part 143e. The first part 141e and the second part 142e may be the same as the first part 141 and the second part 142 of FIG. 4. The third part 143e may be between a first sidewall of an opening OP and the first part 141e and includes a sloping portion with a sloping top surface that becomes thinner in a direction from a second sidewall of the opening OP toward the first sidewall. The height from the top surface of the hole injection layer 130 to an edge of a top surface of the third part 143e may be lower than a minimum height from the top surface of the hole injection layer 130 to a top surface of the first part 140e.

In both cases where the ejector 10 of FIG. 1 performs printing by moving from the pixel P11 to the pixel P12 via the pixel P21 and where the ejector 10 performs printing by moving from the pixel P12 to the pixel P11 via the pixel 21, the lyophilic pattern 140e may reduce or prevent a force F generated from air current created by the fast moving speed of the ejector 10 from pushing a hole transport solution 150a, already ejected onto the lyophilic pattern 140e of the pixel P11, or the hole transport solution 150a, already ejected onto the lyophilic pattern 140e of the pixel P12, to one side within the opening OP or from causing the hole transport solution 150a to overflow to another pixel.

As described above, the light-emitting display device 100 according to the embodiment of FIG. 2 includes the lyophilic pattern 140 having the first part 141 and the second part 142. The height H3 from the top surface of the hole injection layer 130 to the edge of the top surface of the second part 142 is lower than the minimum height 1-14 from the top surface of the hole injection layer 130 to the top surface of the first part 141. Therefore, when the hole transport solution 150a is ejected from the ejector 10 onto the lyophilic pattern 140 using a nozzle printing method, a force F generated from air current created by the fast moving speed of the ejector 10 may be reduced or prevented from pushing the hole transport solution 150a, already ejected onto the lyophilic pattern 140 of an adjacent pixel, to one side within an opening OP or from causing the hole transport solution 150a to overflow to another pixel.

Accordingly, the shape of the hole transport layer 150, formed by drying the hole transport solution 150a ejected onto the lyophilic pattern 140, may be uniform. The hole transport layer 150 may be formed as the hole transport solution 150a ejected onto the lyophilic pattern 140 is dried, while being within in the opening OP. Therefore, the light-emitting display device 100 may have uniform emission characteristics and may be prevented from displaying mixed colors. As a result, display quality of the light-emitting display device 100 may be improved.

Figure 12:
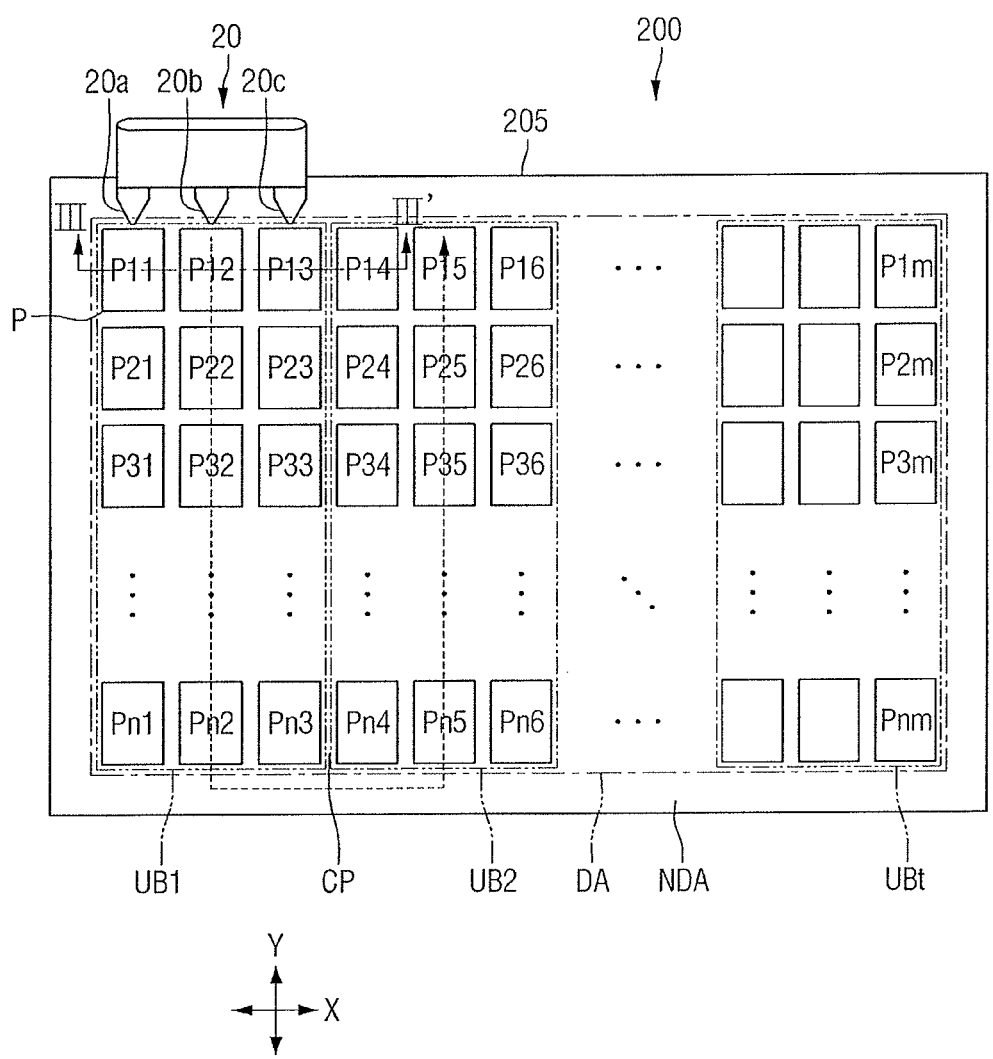
FIG. 12 illustrates another a light-emitting display device.
Figure 13:
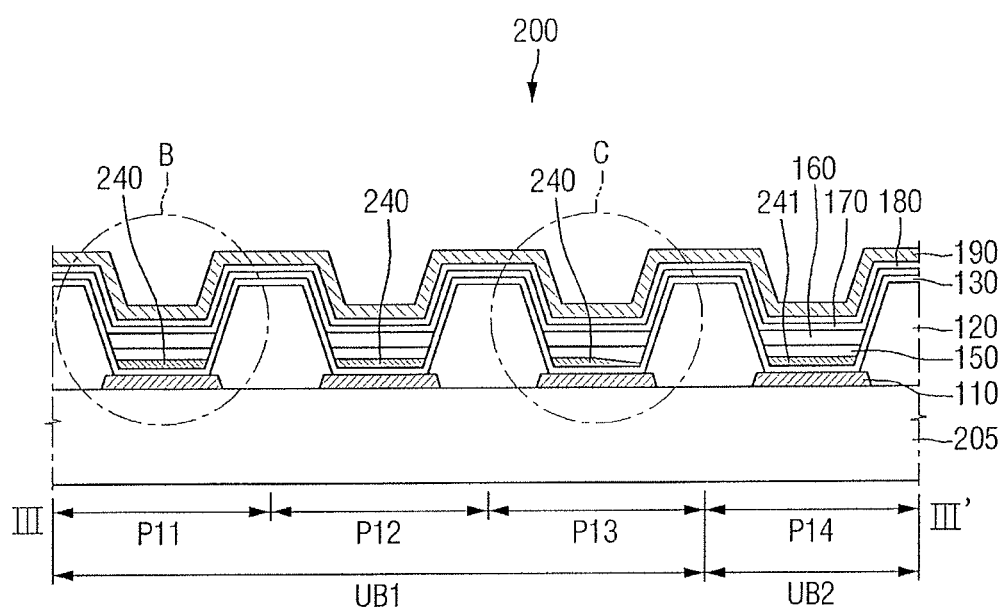
FIG. 13 illustrates a cross-sectional view taken along the line III-III' in FIG. 12.
Figure 14:
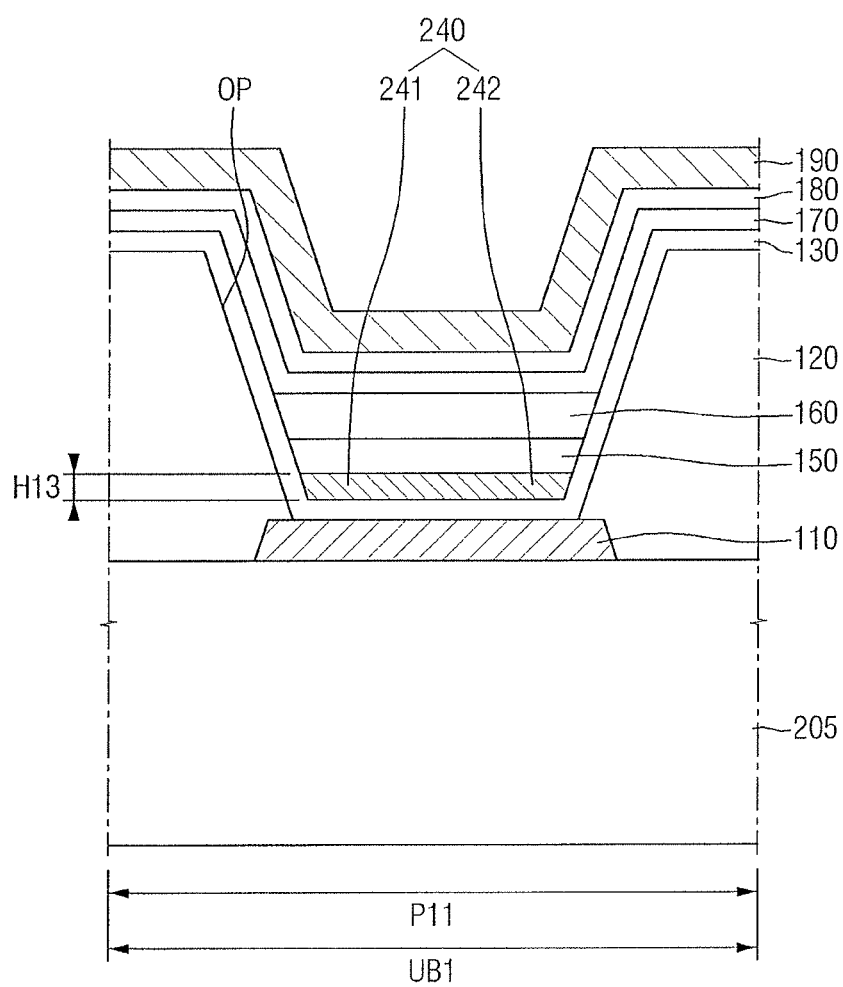
FIG. 14 illustrates an enlarged cross-sectional view of portion B in FIG. 13.
Figure 15:
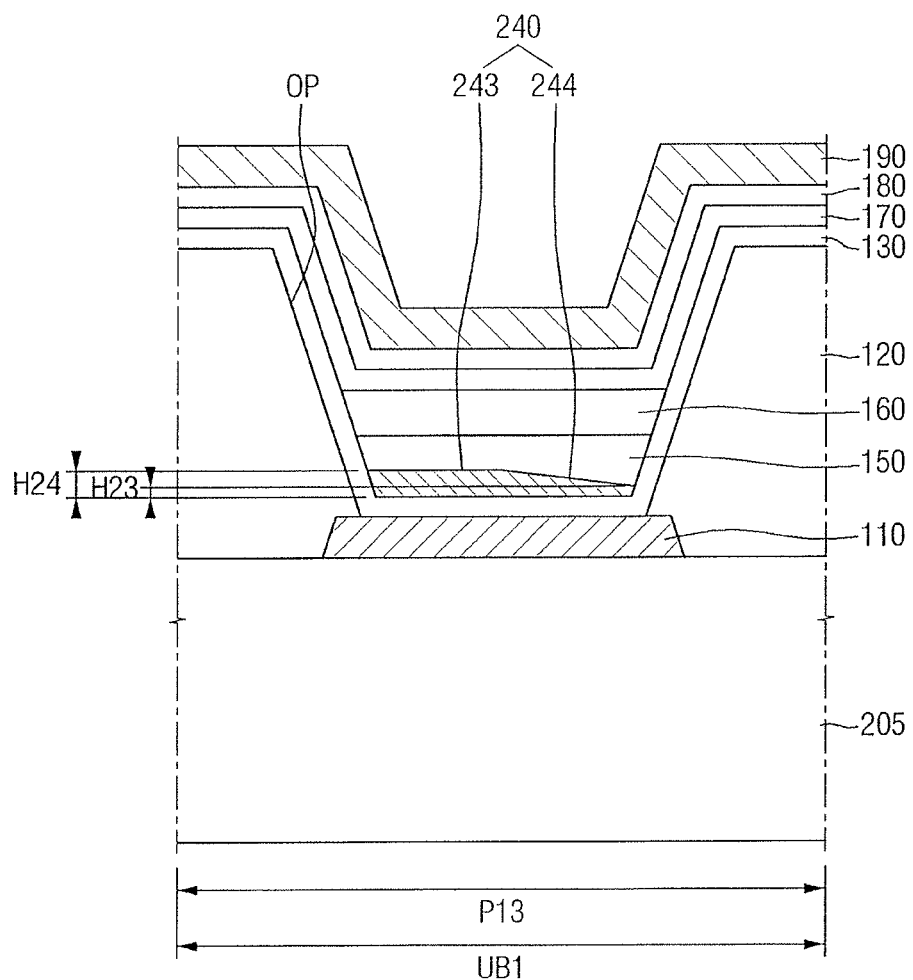
FIG. 15 illustrates a cross-sectional view of portion C in FIG. 13.

FIG. 12 illustrates another embodiment of a light-emitting display device 200. FIG. 13 is a cross-sectional view taken along the line III-III' in FIG. 12. FIG. 14 is an enlarged cross-sectional view of portion B of FIG. 13 and FIG. 15 is an enlarged cross-sectional view of portion C in FIG. 13. The light-emitting display device 200 may be the same as the light-emitting display device 100 of FIG. 2, except for a substrate 205 and a lyophilic pattern 240.

Referring to FIGS. 12 to 15, the light-emitting display deice 200 includes the substrate 205, a first electrode 110, a pixel defining layer 120, a hole injection layer 130, the lyophilic pattern 240, a hole transport layer 150, a light-emitting layer 160, an electron transport layer 170, an electron injection layer 180, and a second electrode 190. These elements are stacked sequentially in a predetermined direction (Z) of FIG. 13.

The substrate 205 may be similar to the substrate 105 of FIGS. 1 and 2. However, a plurality of pixels P on the substrate 205 may be divided into a plurality of unit pixel blocks, each having a plurality of pixel column groups. The unit pixel blocks may include first through unit pixel blocks UB1 through UBt. The same or a different number of pixel column groups may be in each of the first through $t^{th}$ unit pixel blocks UB1 through UBt. For example, the first unit pixel block UB1 may include a first pixel column group P11, P21, . . . , Pn1, a second pixel column group P12, P22, . . . , Pn2, and a third pixel column group P13, P23, . . . , Pn3. The second unit pixel block UB2 may include a fourth pixel column group P14, P24, . . . , Pn4, a fifth pixel column group P15, P25, . . . , Pn5, and a sixth pixel column group P16, P26, . . . , Pn6.

In one embodiment, each of the first through $t^{th}$ unit pixel blocks UB1 through UBt includes three pixel column groups because an ejector 20 includes three nozzles 20a through 20c. For example, a solution may ejected from the first nozzle 20a to pixels corresponding to the first column group P11, P21, . . . , Pn1 of the first unit block UB1, the solution may ejected from the second nozzle 20b to pixels corresponding to the second column group P12, P22, . . . , Pn2 of the first unit block UB1, and the solution may ejected from the third nozzle 20c to pixels corresponding to the third column group P13, P23, . . . , Pn3 of the first unit block UB1 by using a nozzle printing method.

Thus, the number of pixel column groups in each unit pixel block may be equal to the number of nozzles of one ejector. In another embodiment, the number of pixel column groups may be different from the number of nozzles of an ejector.

The lyophilic pattern 240 may be similar to the lyophilic pattern 140 of FIG. 2. However, the lyophilic pattern 240 may have a different shape in one pixel column group of a unit pixel block from its shape in one or more other pixel column groups of the unit pixel block.

Referring to FIG. 14, the lyophilic pattern 240 on the hole injection layer 130 of a pixel P11 corresponding to the first pixel column group P11, P21, . . . , Pn1 of the first unit pixel block UB1 may include a first part 241 including a flat portion and a second part 242 including a flat portion. The height from a top surface of the hole injection layer 130 to a top surface of the first part 241 and the height from the top surface of the hole injection layer 130 to a top surface of the second part 241 may be equal to H13. The lyophilic pattern 240 on the hole injection layer 130 of a pixel P12 corresponding to the second pixel column group P12, P22, . . . , Pn2 of the first unit pixel block UB1 may have the same structure as the lyophilic pattern 240 on the hole injection layer 130 of the pixel P11 corresponding to the first pixel column group P11, P21, . . . , Pn1 of the first unit pixel block UB1. This structure may apply to all pixels corresponding to the first pixel column group P11, P21, . . . , Pn1 of the first unit pixel block UB1 and all pixels corresponding to the second pixel column group P12, P22, . . . , Pn2 of the first unit pixel block UB1.

Referring to FIG. 15, the lyophilic pattern 240 on the hole injection layer 130 of a pixel P13 corresponding to the third pixel column group P13, P23, . . . , Pn3 of the first unit pixel block UB1 may include a first part 243 including a flat portion and a second part 244 including a sloping portion. The height H23 from the top surface of the hole injection layer 130 to an edge of a top surface of the second part 244 may be lower than a minimum height H24 from the top surface of the hole injection layer 130 to a top surface of the first part 243. This structure may apply to all pixels corresponding to the third pixel column group P13, P23, . . . , Pn3 of the first unit pixel block UB1.

As described above, only the second part 244 of the lyophilic pattern 240 on the hole injection layer 130 of each pixel corresponding to the third pixel column group P13, P23, . . . , Pn3, among the first through third pixel columns groups P11, P21, . . . , Pn1 through P13, P23, . . . , Pn3 of the first unit pixel block UB1, may include a sloping portion.

The ejector 20 having three nozzles 20a through 20c ejects a hole transport solution 150a (see, e.g., FIG. 5) onto the lyophilic pattern 240 inside each opening OP of the pixel defining layer 120, while moving over the pixels P on a unit pixel block-by-unit pixel block basis (e.g., while moving over the first unit pixel block UB1 and the second unit pixel block UB2 sequentially as indicated by a dotted line in FIG. 12 using the nozzle printing method). When this occurs, force generated from air current created by the fast moving speed of the ejector 20 may affect the hole transport solution 150a (see FIG. 5) already ejected into the pixels corresponding to the third column group P13, P23, . . . , Pn3 of the first unit block UB1, which faces a boundary CP between the adjacent first and second unit blocks UB1 and UB2. In order to increase the resistance of the hole transport solution 150a rejected into the pixels corresponding to the third pixel column group P13, P23, . . . , Pn3 of the first unit block UB1, only the second part 244 of the lyophilic pattern 240, on the hole injection layer 130 of each of the pixels corresponding to the third pixel column group P13, P23, . . . , Pn3, may include a sloping portion.

In the illustrative embodiment described above, the location of each lyophilic pattern having a sloping portion is determined, for example, by the number of nozzles in one ejector. Also, in another embodiment, the second part 244 including a sloping portion may be replaced by any one of the second parts 142a through 142e of FIGS. 6 through 11.

As described above, in the light-emitting display device 200 according to the current embodiment, only the second part 244 of the lyophilic pattern 240, on the hole injection layer 130 of each pixel corresponding to any one column pixel group of a unit pixel block, includes a sloping portion according to the number of nozzles in an ejector. Therefore, the lyophilic pattern 240 may be easily patterned.

FIGS. 16 to 30 are cross-sectional and plan views illustrating an embodiment of a method for fabricating a light-emitting display device. The light-emitting display device may be any of the aforementioned embodiments. In FIGS. 16 through 30, a pixel P11 and a pixel P12 are illustrated as an example.

Figure 16:
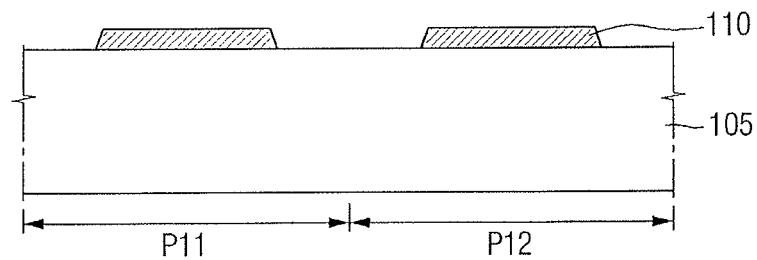

Referring to FIG. 16, a first electrode 110 is formed on a substrate 105 of each pixel of a plurality of pixels P. The first electrode 110 may be formed, for example, by depositing and patterning a transparent electrode material or a reflective electrode on the substrate 105.

Figure 17:
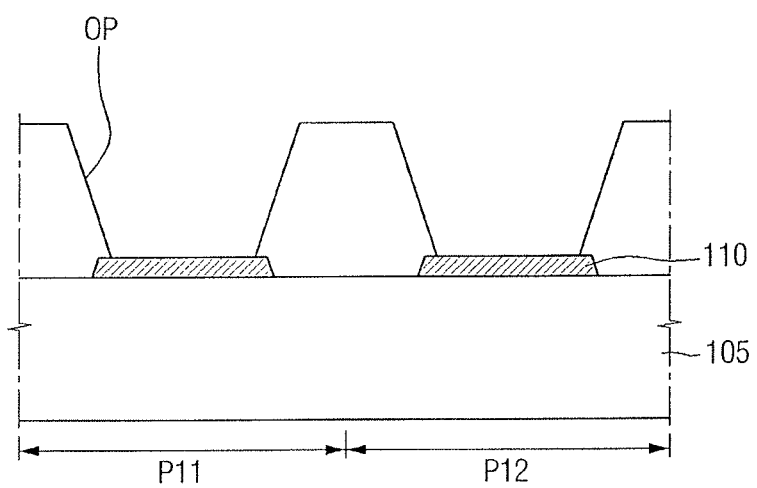

Referring to FIG. 17, a pixel defining layer 120 is formed on the substrate 105 to define each pixel P and has a plurality of openings OP to expose the first electrodes 110. The pixel defining layer 120 may be formed, for example, by depositing an insulating material on the whole surface of the substrate 105 to cover the first electrodes 110 using a deposition method and then patterning the deposited insulating material.

Figure 18:
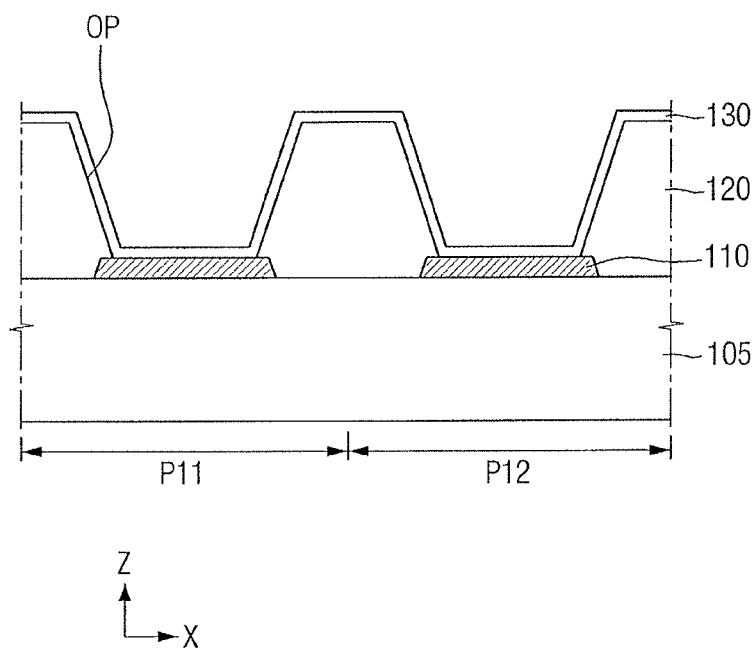

Referring to FIG. 18, a hole injection layer 130 is formed on the first electrodes 110. The hole injection layer 130 may be formed, for example, not only on the first electrodes 110 but also on the whole surface of the pixel defining layer 120 using slit coating.

Figure 19:
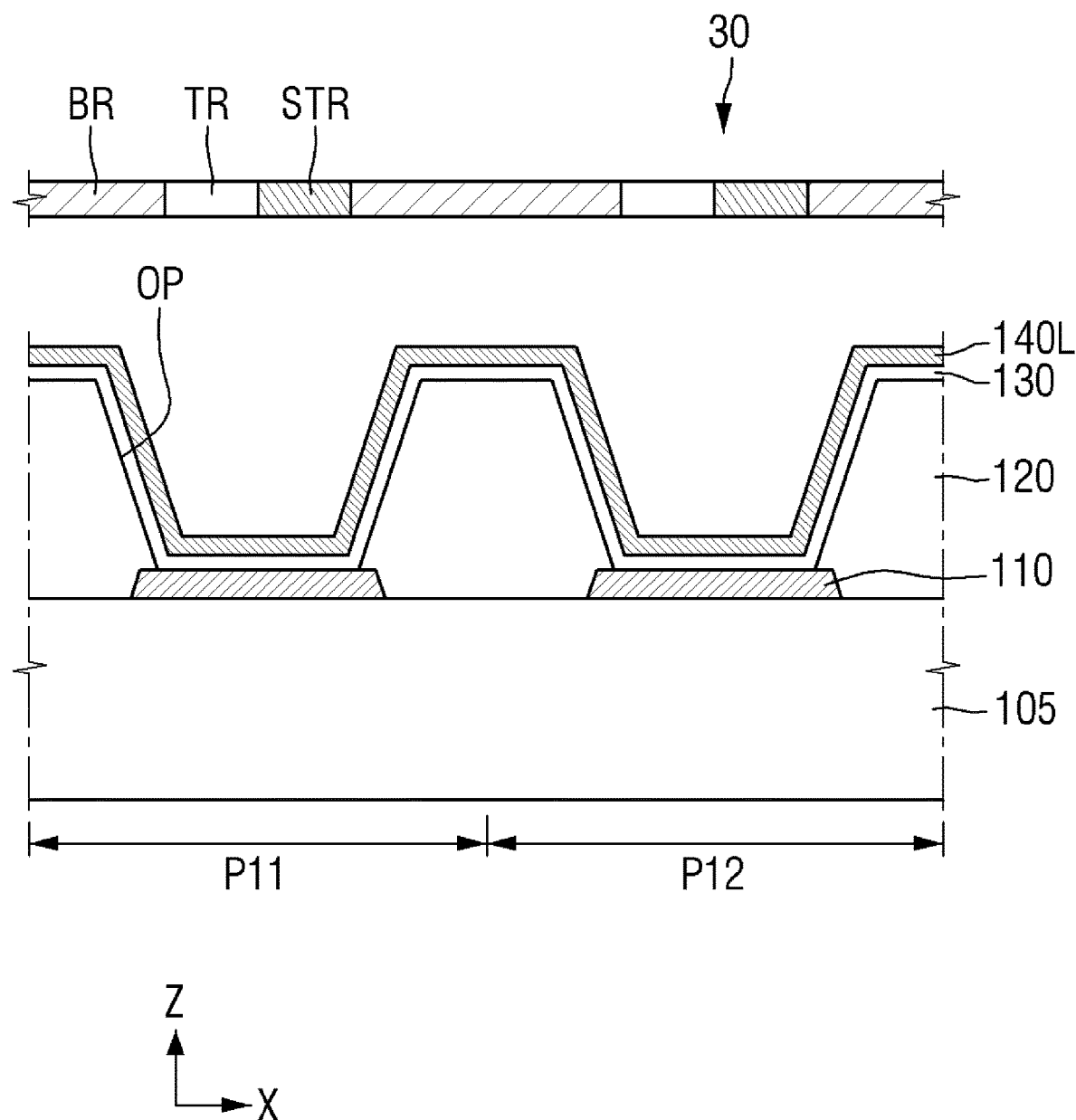

Referring to FIGS. 19 through 21, a lyophilic pattern 140 is formed on the hole injection layer 130 in each pixel P using a pattern mask 30. Referring to FIG. 19, a lyophilic material layer 140L is formed, for example, by coating a lyophilic solution on the hole injection layer 130 using, e.g., slit coating. The pattern mask 30 is placed above the lyophilic material layer 140L to face the lyophilic material layer 140L, and then light is irradiated to the lyophilic material layer 140L.

The pattern mask 30 may include a blocking region BR, a transmitting region TR, and a semi-transmitting region STR which are repeatedly and alternately arranged. The blocking region BR blocks light and faces a top surface of the pixel defining layer 120. The transmitting region TR passes light and is placed to correspond to a part of the lyophilic material layer 140L which overlaps the first electrode 110 and is adjacent to a first sidewall, from among first and second sidewalls of each opening OP which face each other in a first direction X. The semi-transmitting region STR adjusts the transmittance of light and is placed to correspond to a part of the lyophilic material layer 140L which overlaps the first electrode 110 and is adjacent to the second sidewall of each opening OP.

Referring to FIG. 20, the pattern mask 30 may include a transparent substrate 31, a blocking layer 32 on the transparent substrate 31 in a region corresponding to the blocking region BR, and a semi-transmitting layer 33 on the blocking layer 31 in a region corresponding to the blocking region BR and the semi-transmitting region STR. The transparent substrate 31 may be, for example, a quartz substrate. The blocking layer 32 may be made, for example, of any one of, e.g., chrome, molybdenum silicide, tantalum, aluminum, silicon, silicon oxide, and silicon oxynitride. In one embodiment, the semi-transmitting layer 33 may be made of a chrome oxide layer or a chrome oxynitride layer. The transmittance of light in the semi-transmitting region STR may be adjusted by controlling a thickness of the semi-transmitting layer 33. For example, the thickness of the semi-transmitting layer 33, in a part of the semi-transmitting region STR in which the transmittance of light transmittance is to be increased, may be lower than that of the semi-transmitting layer 33 in a part of the semi-transmitting region STR in which the transmittance of light is to be decreased.

The current embodiment may use, for example, a negative photolithography method. In this case, to make an edge of a second part 142 of the lyophilic pattern 140 thin, the amount of exposure of a region of the lyophilic material layer 140L, in which the edge of the second part 142 of the lyophilic pattern 140 is to be formed, may be relatively small. Accordingly, the semi-transmitting layer 33 in a part of the semi-transmitting region STR corresponding to the region of the lyophilic material layer 140L, in which the edge of the second part 142 of the lyophilic pattern 140 is to be formed, may be thicker than in other parts of the semi-transmitting region STR.

After the mask pattern 30 is placed over the lyophilic material layer 140L, when light is irradiated to the lyophilic material layer 140L, only an exposed part of the lyophilic material layer 140L may remain in a development process. As a result, the lyophilic pattern 140 may be formed in each pixel P as illustrated in FIG. 21. The thickness of the exposed part may vary, for example, according to the amount of exposure to light.

The pattern mask 30 in FIG. 20 includes the substrate 31, the blocking layer 32, and the semi-transmitting layer 33. In another embodiment, the pattern mask 30 may include a substrate and a blocking layer without a semi-transmitting layer, as illustrated in FIGS. 22 and 23.

Figure 22:
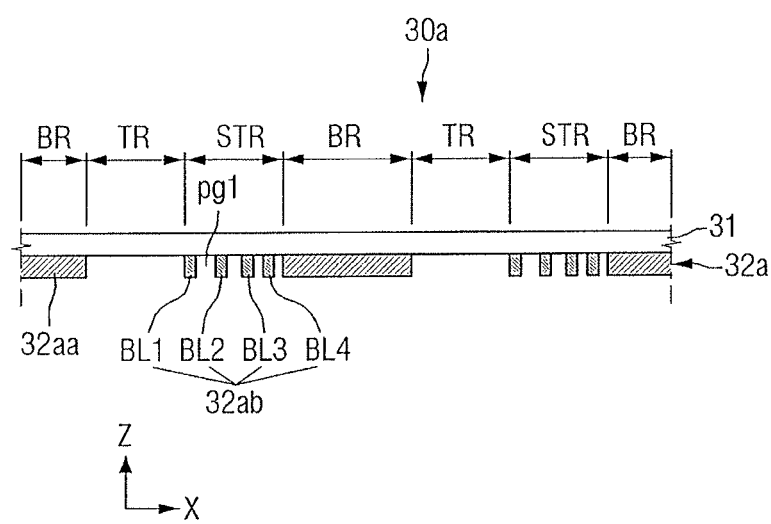
Figure 23:
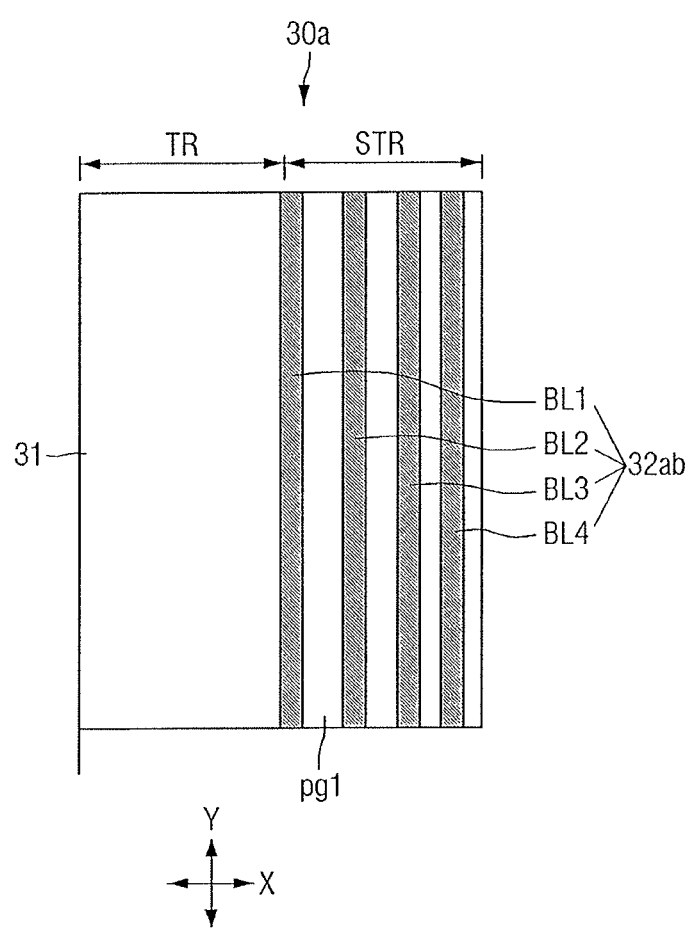

Referring to FIGS. 22 and 23, a pattern mask 30a may include a transparent substrate 31 and a blocking layer 32a on the transparent substrate 31 in a region corresponding to a blocking region BR and a semi-transmitting region STR. The blocking layer 32a may be similar to the blocking layer 32 of FIG. 20. However, the blocking layer 32a may include a continuous part 32aa in the blocking region BR and a pattern part 32ab including a plurality of lines BL1 through BL4 in the semi-transmitting region STR. Grooves pg1 between the lines BL1 through BL4 may become narrower in a direction (i.e., the X direction) from the first sidewall of each opening OP toward the second sidewall. The grooves pg1 may adjust the transmittance of light that passes through the semi-transmitting region STR of the pattern mask 30a. For example, the transmittance of light may be lower as the grooves pg1 are narrower.

Figure 24:
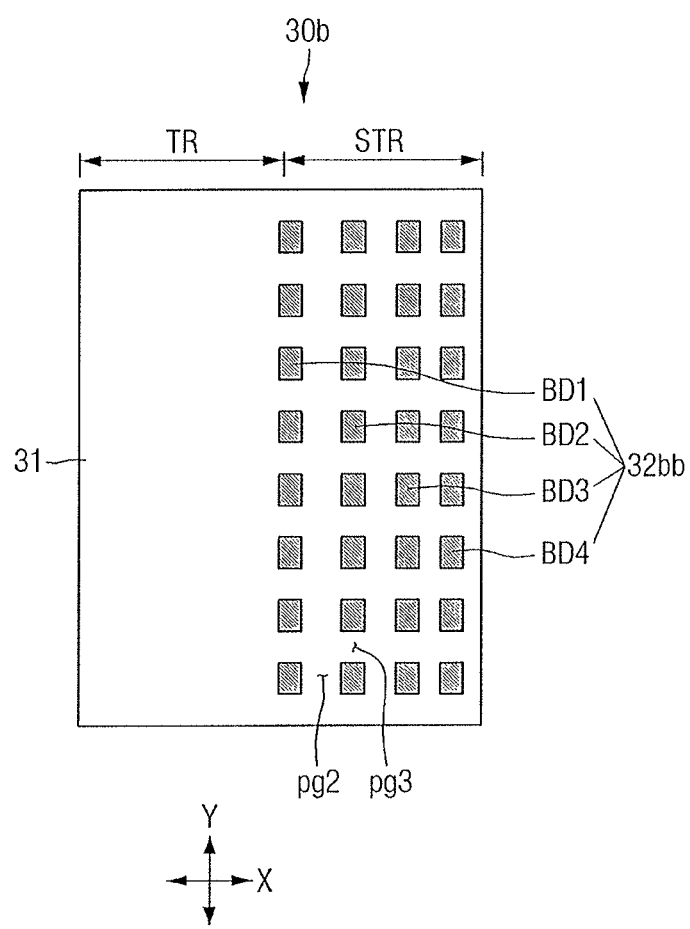

Referring to FIG. 24, a pattern mask 30b may be the same as the pattern mask 30a of FIGS. 22 and 23, except that the pattern part 32ab including the lines BL1 through BL4 is replaced by a pattern part 32bb that includes a plurality of dot patterns BLD1 through BLD3. Grooves pg2 between the dot patterns BLD1 through BLD4 may become narrower in the direction (i.e., the X direction) from the first sidewall of each opening OP toward the second sidewall. The grooves pg2 may control the transmittance of light passing through a semi-transmitting region STR of the pattern mask 30b. For example, the transmittance of light may be lower as the grooves pg2 are narrower. Grooves pg3 arranged along a direction (i.e., a Y direction), perpendicular to the direction from the first sidewall of each opening OP toward the second sidewall, may have equal widths.

Figure 25:
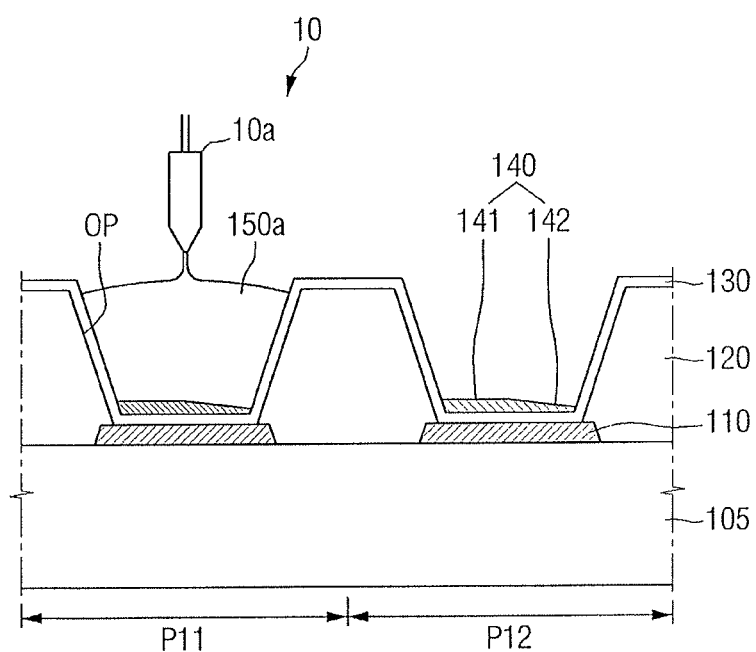
Figure 26:
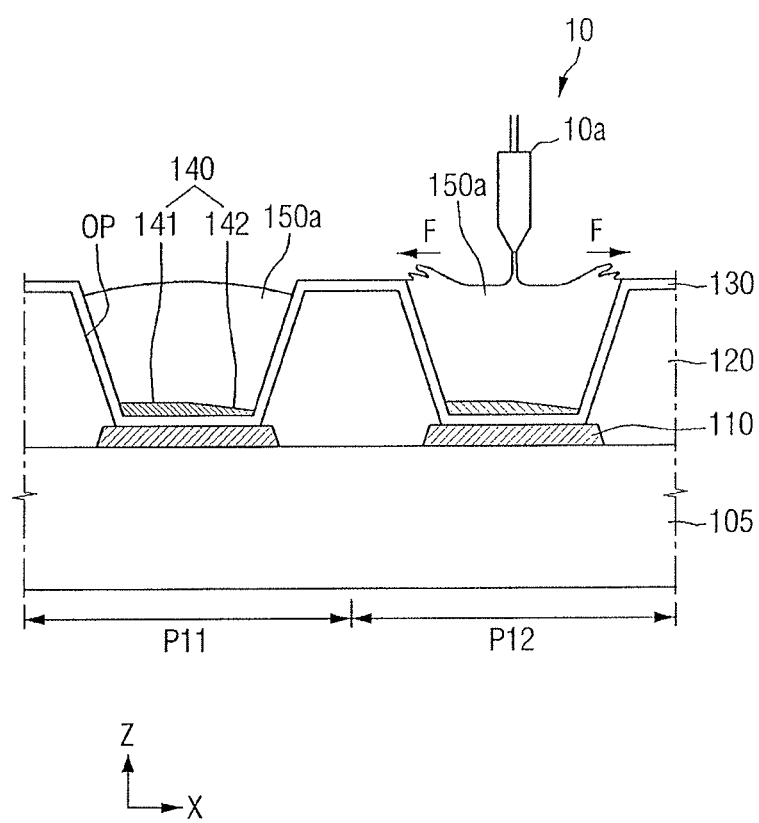
Figure 27:
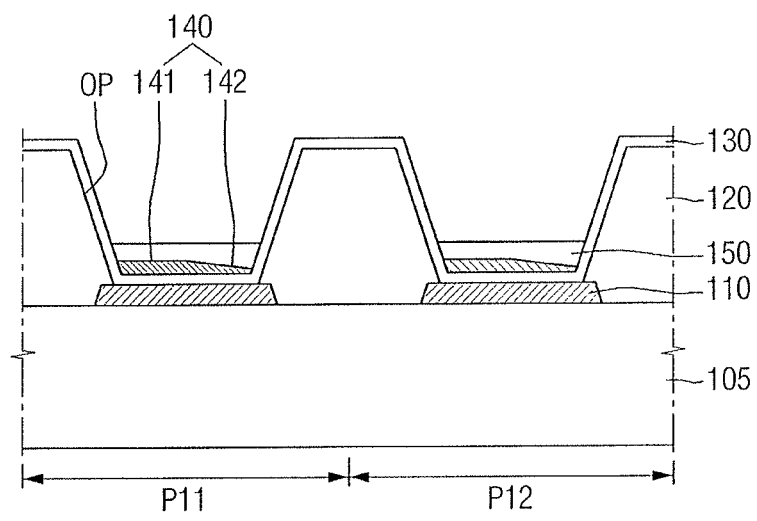

Referring to FIGS. 25 through 27, a hole transport layer 150 is formed on the lyophilic pattern 140 in each pixel P. Referring to FIG. 25, a hole transport solution 150a is ejected from an ejector 10 onto the lyophilic pattern 140 of the pixel P11 using a nozzle printing method. Then, the ejector 10 is moved toward the pixel P12 via a pixel P21 to eject the hole transport solution 150a onto the lyophilic pattern 140 of pixel P12.

Referring to FIG. 26, when the hole transport solution 150a is provided onto the lyophilic pattern 140 of the pixel P12, a force F is generated from air current created by the fast moving speed of the ejector 10. However, the resistance of the hole transport solution 150a to the force F is increased by the sloping second part 142 of the lyophilic pattern 140 of the pixel P11. The increased resistance may reduce or prevent the hole transport solution 150a, already ejected onto the lyophilic pattern 140 of the pixel P11, from being pushed to one side (e.g., toward the first sidewall of the opening OP) within the opening OP and then remaining in this state or from overflowing to another pixel. If the hole transport solution 150a is dried in this state, the hole transport layer 150 having a uniform shape may be formed within each of the pixels P11 and P12 as in FIG. 27.

Figure 28:
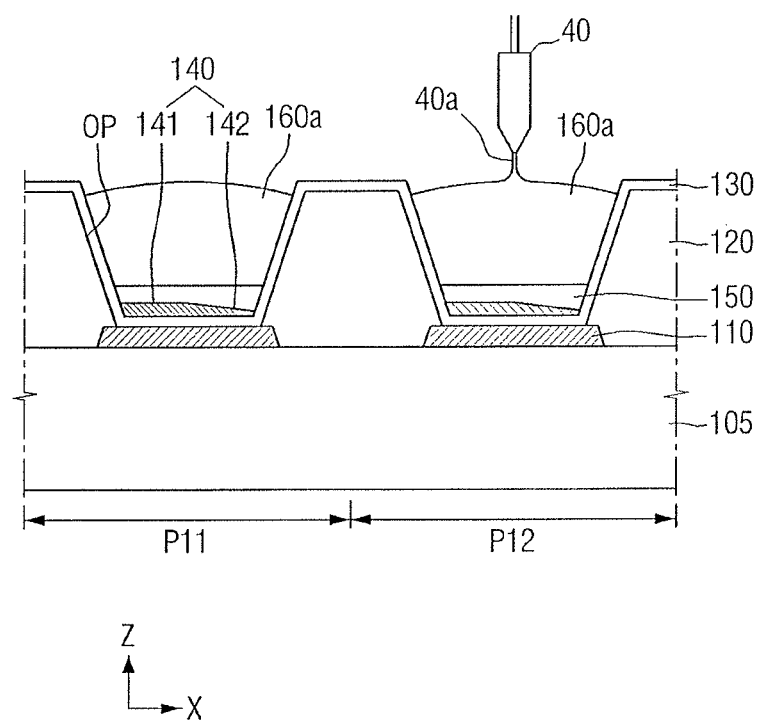
Figure 29:
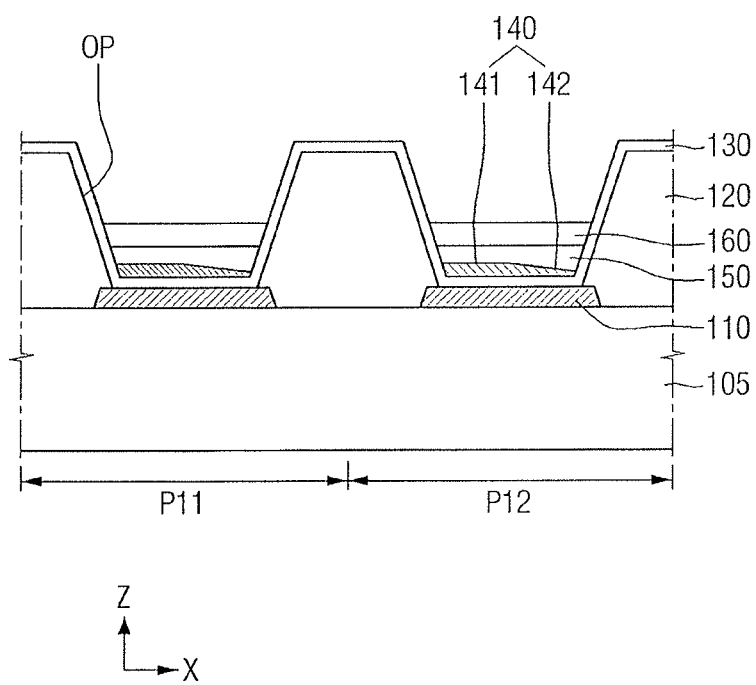

Referring to FIGS. 28 and 29, a light-emitting layer 160 is formed on the hole transport layer 150. Referring to FIG. 28, a light-emitting solution 160a is ejected from an ejector 40 into each opening OP of the pixel defining layer 120 using an inkjet printing method or a nozzle printing method. The light-emitting solution 160a may include the same solvent as the hole transport solution 150a of FIG. 25. In this case, the hole transport layer 150 may be lyophilic to the light-emitting solution 160a.

Referring to FIG. 29, the light-emitting solution 160a is dried to thereby form the light-emitting layer 160 on the hole transport layer 150.

Figure 30:
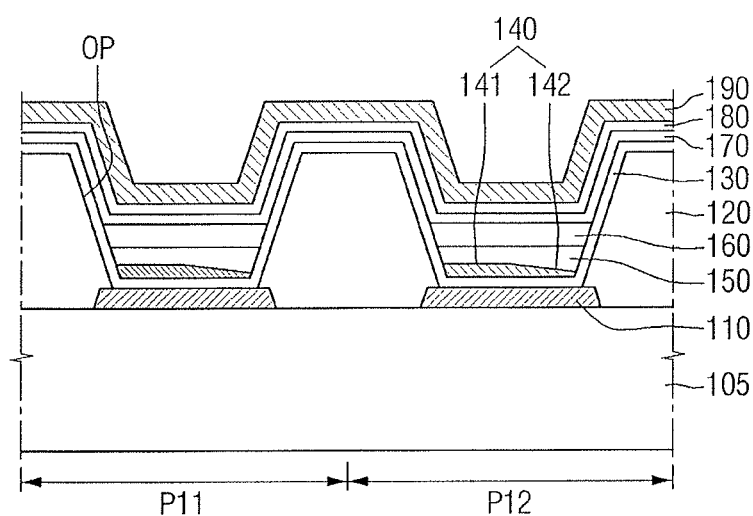

Referring to FIG. 30, an electron transport layer 170, an electron injection layer 180, and a second electrode 190 are formed on the light-emitting layer 160. The electron transport layer 170, the electron injection layer 180, and the second electrode 190 may be formed by a deposition process.

The method of fabricating a light-emitting display device according to the current embodiment may further include placing an encapsulation substrate on the second electrode 190. In addition, the method of manufacturing a light-emitting display device according to the current embodiment may further include placing a spacer between the second electrode 190 and the encapsulation substrate. Various methods of placing the encapsulation substrate and the spacer are widely known to those of ordinary skill in the art.

By way of summation and review, a lyophilic pattern may be formed on the anode in order to increase wettability of a hole transport solution. When a hole transport solution is ejected onto the lyophilic pattern using the nozzle printing method, force generated from air current created by the fast moving speed of the ejector may push the hole transport solution to one side of the lyophilic pattern. As a result, the hole transport solution may dry to have a non-uniform shape. This may cause the display to have non-uniform emission characteristics, and thus reduced display quality.

Also, if the hole transport solution pushed to one side overflows to an adjacent pixel, the hole transport layer may be formed in part of the adjacent pixel. In this case, the organic light-emitting layer on the hole transport layer may also be formed in the part of the adjacent pixel. Therefore, organic light-emitting layers that emit light of different colors in adjacent pixels may overlap each other. This may cause an unwanted mixing of different color light, which also reduces display quality.

In accordance with one or more of the aforementioned embodiments, a light-emitting display device may formed to have uniform emission characteristics and to prevent mixing of displayed light from one or more pixels. As a result, display quality of the light-emitting display device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present embodiments as set forth in the following claims.

What is claimed is:

1. A method of fabricating a light-emitting display device, the method comprising:
    forming a first electrode in each of a plurality of pixels, the pixels arranged in first and second directions that cross each other;
    forming a pixel defining layer including a plurality of openings that respectively expose the first electrode of corresponding ones of the pixels;
    forming a hole injection layer on the first electrode;
    forming a lyophilic pattern including a first part adjacent to a first sidewall of an opening of the plurality of openings and a second part adjacent to a second sidewall of the opening;
    forming a hole transport layer on the lyophilic pattern;
    forming a light-emitting layer on the hole transport layer; and
    forming a second electrode on the light-emitting layer, wherein the lyophilic pattern is formed such that a height from a top surface of the hole injection layer to an edge of a top surface of the second part is lower than a height from the top surface of the hole injection layer to a top surface of the first part,
    wherein the second part is a part of the lyophilic pattern that is closest to the second sidewall of the opening.

2. The method as claimed in claim 1, wherein forming the lyophilic pattern includes:
    forming a lyophilic material layer by coating a lyophilic solution on the hole injection layer;
    placing a pattern mask above the lyophilic material layer and irradiating light on the pattern mask, the pattern mask including a blocking region, a transmitting region and a semi-transmitting region;
    forming the first part of the lyophilic pattern using a part of the lyophilic material layer which corresponds to the transmitting region of the pattern mask; and
    forming the second part of the lyophilic pattern using a part of the lyophilic material layer which corresponds to the semi-transmitting region of the pattern mask, forming the second part including leaving an exposed part of the lyophilic material layer exposed to the light through a development process, wherein:
    the blocking region is placed to correspond to a top surface of the pixel defining layer,
    the transmitting region is placed to correspond to a part of the lyophilic material layer which overlaps the first electrode and is adjacent to the first sidewall of the opening in the first direction, and
    the semi-transmitting region is placed to correspond to a part of the lyophilic material layer which overlaps the first electrode and is adjacent to the second sidewall of the opening.

3. The method as claimed in claim 2, wherein:
    an amount of exposure of the part of the lyophilic material layer which corresponds to the semi-transmitting region is smaller than an amount of exposure of the part of the lyophilic material layer which corresponds to the transmitting region, and
    the amount of exposure of the part of the lyophilic material layer which corresponds to the semi-transmitting region decreases from the first sidewall toward the second sidewall of the opening.

* * * * *